United States Patent
Noda et al.

(10) Patent No.: US 11,935,668 B2
(45) Date of Patent: Mar. 19, 2024

(54) CONDUCTIVE MATERIAL, AND CONDUCTIVE FILM AND SOLAR CELL USING SAME

(71) Applicant: Waseda University, Tokyo (JP)

(72) Inventors: Suguru Noda, Tokyo (JP); Rongbin Xie, Tokyo (JP)

(73) Assignees: Waseda University, Tokyo (JP); Sino-Japan Electric Heater Co., Ltd., Kaohsiung (TW)

(*) Notice: Subject to any disclaimer, the term of this patent is extended or adjusted under 35 U.S.C. 154(b) by 0 days.

(21) Appl. No.: 17/909,384

(22) PCT Filed: Jul. 9, 2020

(86) PCT No.: PCT/JP2020/026900
§ 371 (c)(1),
(2) Date: Sep. 4, 2022

(87) PCT Pub. No.: WO2021/176744
PCT Pub. Date: Sep. 10, 2021

(65) Prior Publication Data
US 2023/0100804 A1    Mar. 30, 2023

(30) Foreign Application Priority Data
Mar. 6, 2020    (JP) .................................. 2020-039321

(51) Int. Cl.
*H01B 1/24*    (2006.01)
*C08L 25/18*    (2006.01)
(Continued)

(52) U.S. Cl.
CPC ............... *H01B 1/24* (2013.01); *C08L 25/18* (2013.01); *H01B 1/128* (2013.01); *H01B 5/14* (2013.01);
(Continued)

(58) Field of Classification Search
None
See application file for complete search history.

(56) References Cited

U.S. PATENT DOCUMENTS

| 2010/0136224 A1* | 6/2010 | Britz | C09D 7/61 977/932 |
| 2014/0087164 A1* | 3/2014 | LeMieux | H01B 1/04 977/734 |

FOREIGN PATENT DOCUMENTS

| JP | 2018-203969 A | 12/2018 |
| WO | 2013/042482 A1 | 3/2013 |

(Continued)

OTHER PUBLICATIONS

English machine translation of Matsunaga et al. (WO-2013073259-A1), downloaded from PE2E Search; PDF pp. 1-20. (Year: 2013).*

(Continued)

*Primary Examiner* — Katie L. Hammer
(74) *Attorney, Agent, or Firm* — Akerman LLP

(57) ABSTRACT

Provided is a conductive material that is capable of achieving a high-electric conductivity, long-term stability under an atmospheric environment, heat and humidity stabilities, as well as a conductive film and a solar cell using the same. The conductive material includes a mixture of carbon nanotubes (CNTs) and polystyrene sulfonic acid (PSS acid). The element ratio (S/C ratio) of sulfur (S) to carbon (C) in the mixture may be from 0.001 to 0.1 in terms of the number of atoms. CNTs and PSS acid may make up a content percentage of 10 wt % or more in the mixture. These conductive films comprised of the conductive material 6 may have a weight per unit area of the CNTs in the range from 1 mg/m² to 10000 mg/m². The solar cell may include the conductive film 7, wherein the film is on the surface of a semiconductor.

6 Claims, 16 Drawing Sheets

(51) Int. Cl.
  *H01B 1/12*      (2006.01)
  *H01B 5/14*      (2006.01)
  *H01L 31/0216*   (2014.01)
  *H01L 31/0224*   (2006.01)
  *H10K 30/50*     (2023.01)
  *H10K 30/82*     (2023.01)
  *H10K 85/10*     (2023.01)
  *H10K 85/20*     (2023.01)

(52) U.S. Cl.
  CPC ............. *H01L 31/02167* (2013.01); *H01L 31/022425* (2013.01); *H10K 30/50* (2023.02); *H10K 30/821* (2023.02); *H10K 85/141* (2023.02); *H10K 85/221* (2023.02); *Y02E 10/50* (2013.01); *Y02E 10/549* (2013.01)

(56) References Cited

FOREIGN PATENT DOCUMENTS

| WO | 2013/073259 | A1 |   | 5/2013  |              |
|----|-------------|----|---|---------|--------------|
| WO | WO-2013073259 | A1 | * | 5/2013 | ............. B82Y 30/00 |
| WO | 2014/084159 | A1 |   | 6/2014  |              |
| WO | 2018/225863 | A1 |   | 12/2018 |              |
| WO | WO-2018225863 | A1 | * | 12/2018 | ............... C08K 3/04 |

OTHER PUBLICATIONS

English machine translation of ZHOU et al. (WO 2018/225863 A1) accessed online from Espacenet; PDF pp. 1-37. (Year: 2018).*
International Search Report dated Sep. 24, 2020 issued in connection with PCT/JP2020/026900.
Laurent, et al., "The Weight and Density of Carbon Nanotubes Versus the Number of Walls and Diameter," Carbon 48, 2010, pp. 2989-2999.
Ishida, et al., "Structure and Mechanical Properties of Nafion Membranes," Journal of the Society of Materials Science, vol. 56, No. 11, Nov. 2007, pp. 1005-1009.
O'Connell, et al., "Reversible Water-Solubilization of Single-Walled Carbon Nanotubes by Polymer Wrapping," Chemical Physics Letters, vol. 342, 2011, pp. 265-271.
Hassam et al., "Dispersion of Single and Multiwalled Nanotubes with Poly(sodium styrene sulfonate) ] Effect of pH and Ionic Strength on Dispersion Stability," Aust. J. Chem., 2014, vol. 67, pp. 66-70.
Jeong et al., "Direct Patterning of Conductive Carbon Nanotube/Polystyrene Sulfonate Composites via Electrohydrodynamic Jet Printing for use in Organic Field-Effect Transistors," Journal of Materials Chemistry C, 2016, vol. 4, pp. 4912-4919.
Shirae, et al., "Overcoming the Quality-Quantity Tradeoff in Dispersion and Printing of Carbon Nanotubes by a Repetitive Dispersion-Extraction Process," Carbon 91, 2015, pp. 20-29.

* cited by examiner

CONDUCTIVE MATERIAL, AND CONDUCTIVE FILM AND SOLAR CELL USING SAME

CROSS-REFERENCE TO RELATED APPLICATIONS

This application is a national phase of PCT/JP2020/026900, filed Jul. 9, 2020, and claims priority to Japanese Patent Application No. 2020-039321, filed on Mar. 6, 2020, the entire contents of both of which are hereby incorporated by reference.

TECHNICAL FIELD

The present invention relates to a conductive material, and a conductive film and a solar cell using the same.

BACKGROUND ART

Carbon nanotubes (hereafter referred to as CNTs) have a wide range of applications in the field of, for example, electronics and energy devices due to their unique one-dimensional structures, excellent inherent electric/electronic properties, and high chemical and thermal stabilities.

CNTs are electrically conductive materials excellent in flexibility and lightweight properties, which have been studied for a variety of applications such as transparent conductive films, transparent heaters, and lightweight electrically conductive wires, though unfortunately, in the current state of the art, they are short in electrical conductivity. A variety of dopants for CNTs are known. However, to date, stable and high performing doping has never been achieved. For this reason, a variety of dopant has been studied for improving the electrical conductivity in CNTs.

For example, $SOCl_2$, $HNO_3$, $HAuCl_4$, and the like are typical dopants that are adsorbed onto the surface of CNTs to strip off electrons, thereby doping the CNTs strongly into p-types which results in the enhancement of electric conductivity in the CNTs. These dopants, however, are eliminated in a short time and therefore are poor in stability. Meanwhile, poly(3,4-ethylene dioxythiophene) (hereafter referred to as PEDOT) is a typical conducting polymer that exhibits high-conductive property when doped into p-type with the aid of polystyrene sulfonic acid (hereafter referred to as PSS acid). However, PEDOTs agglomerate over time, which results in a reduction in their electric conductivity.

Whilst considerable research has been conducted for the enhancement of electric conductivity in CNTs by doping, no prior art studies can be found for CNT conductive films that employ PSS acid as a dopant. Meanwhile, PSS acid or polystyrene sulfonate compounds (polystyrene sulfonates; hereafter also referred to as PSSs) in aqueous or ethanol solution were reported to be effective for dispersing CNTs (see, for example, non-patent documents 1 to 3, patent documents 1 and 2). Polystyrene sulfonates include PSS acid salts and PSS acid esters of which PSS sodium salt (poly(sodium styrene sulfonate) or sodium polystyrene sulfonate) was reported to be particularly a good dispersant for the CNTs according to non-patent documents 2 and 3. PSS acid and polystyrene sulfonates are often both abbreviated as PSS in general. However, since the PSS acid is a strong acid while polystyrene sulfonates are salts or esters, these have totally different properties in nature.

A good dispersion condition for CNTs in liquid could realize the full potential of the CNTs in various applications. Usually, CNTs are difficult to disperse by themselves in an aqueous solution due to their van der Waals, π-π stacking, and hydrophobic interactions. By adsorption and wrapping surfactants, surface functionalization, and exfoliation, CNTs could disperse well in an aqueous solution. However, the residual surfactants and the use of a concentrated strong acid hinder feasibility in practical manipulation and application. A simple and highly efficient dispersion method is therefore strongly desired.

CNTs-incorporated transparent conductive films (CNT-TCFs) endow the fabrication of flexible optoelectronic and bioelectronic devices. Generally, the fabrication approaches of CNT-TCFs can be divided into a dry process and a wet process. For the dry process, CNTs produced in the gas phase by means of the floating catalyst chemical vapor deposition (FCCVD) are directly collected downstream of the reactor by filtering the flow through a membrane filter, which enables one to retain high-quality films without causing any damage to the CNTs. However, according to this method, since CNTs are not aggregated in the reactor but rather are formed as thin films on the membrane filter, these CNTs in the reactor are required to be kept at a lower concentration, which results in an essential problem of low productivity. Meanwhile, a highly productive synthesis technology for synthesizing CNTs in the reactor in high concentration to obtain them as flocculent agglomerates is now in practical use. If such ready-made CNT agglomerates are to be used, the CNTs need to be dispersed beforehand for which a wet process is to be employed. The wet process is comprised of several steps, including dispersion of CNTs, followed by filtration or coating to form the film, removal of the surfactant, and doping treatment. In this case, there exists a quality-quantity tradeoff; stronger dispersion increases the yield from CNT powder to CNT films but it increases the damage to the CNT films as well.

Previously, the present inventors proposed a repetitive dispersion-extraction process to overcome this tradeoff (see Non-patent document 4), and achieved a high conversion rate (approximately 90%) of CNT agglomerates into films while minimizing the damage to the CNTs by repeating 13 cycles of the processes of adding CNT powder to an aqueous solution of sodium dodecylbenzene sulfonate (SDBS) that is a dispersant, dispersing a part of the CNT powder by mild ultrasonication (for 3 minutes), performing centrifugation to extract the CNT dispersion liquid from the supernatant, and adding SDBS aqueous solution to the deposited CNT agglomerates to perform re-dispersion. However, this method is left with an issue to be described below.

PRIOR ART DOCUMENTS

Patent Documents

Patent document 1: International publication No. WO2013/042482
Patent document 2: International publication No. WO2013/073259

Non-Patent Documents

Non-patent document 1: M. J. O'Connell, et al., Chem. Phys. Lett. 2001, 432, 265.
Non-patent document 2: C. Hassam and D. A. Lewis, Aust. J. Chem. 2014, 67, 66.
Non-patent document 3: Y. J. Jeong, et al., J. Mater. Chem. C 2016, 4, 4912.

Non-patent document 4: H. Shirae, et al., Carbon 2015, 91, 20.

SUMMARY OF THE INVENTION

Technical Problem

Patent document 1 discloses a PSS copolymer, and a dispersant and a dispersion liquid employing this copolymer are reported in the document. However, no reference is made therein for the CNT/PSS composite films formed by the CNT and the PSS, nor any doping of the CNT by the PSS.

Patent document 2 discloses that the PSS is used as a dispersant which is useful for improving the physical property of aqueous dispersions such as CNT or conductive polymers. However, this document merely describes a dispersion effect of the PSS for the CNTs, and no reference is made for the CNT/PSS composite films nor any doping of the CNTs by the PSS.

Non-patent document 1 discloses that polystyrene sulfonates and polyvinylpyrrolidone (PVP) are useful as a dispersant for the CNTs. However, no reference is made for the conductivity of the CNT/polystyrene sulfonate composite films. Further, the polystyrene sulfonates used in non-patent document 1 are salts or esters which are found to have virtually no doping effects as will be described later, and no reference is made therein for the PSS acid.

Non-patent document 2 discloses a dispersion of single-walled carbon nanotubes (SWCNT) and multi-walled carbon nanotubes (MWCNT) by means of the sodium salt of the PSS acid. Non-patent document 2 discusses the mass ratio of the CNTs to PSS sodium salt in a CNT/PSS sodium salt composite that is obtained through filtration of a dispersion liquid, but no reference is made for the conductivity of the CNT/PSS sodium salt composite film. The optimum value of the mass ratio of the CNTs to PSS sodium salt is discussed to be as large as 1 approximately. Further, the PSS used in non-patent document 2 is the PSS acid sodium salt which is found to have virtually no doping effects as will be described later, and no reference is made therein for the PSS acid.

Non-patent document 3 discloses that multiwalled carbon nanotubes (MWCNTs) are dispersed in an ethanol solution of polystyrene sulfonate to form conductive composite patterns using inkjet printing. 1 wt % of MWCNTs were dispersed in 1 mL of ethanol mixed with 50 mg of polystyrene sulfonate. As the polystyrene sulfonate is contained in the amount of about 6 wt %, the weight ratio of CNTs to polystyrene sulfonate in this solution is approximately 1:6. The CNT dispersion liquid is directly printed in ink without any washing, and therefore a considerable excessive amount of polystyrene sulfonate is contained therein. Further, the polystyrene sulfonate used in non-patent document 3 is salt or ester which is found to have virtually no doping effects as will be described later, and no reference is made therein for the PSS acid.

However, according to the CNT-TCF manufacturing method, as developed by the present inventors, which utilizes SDBS as a dispersant, there remain some issues relating to the removal of SDBS by washing with hot water or acids, as well as the addition of dopants to the as-prepared film. The CNT-TCFs doped with nitric acid showed unstable electrical properties in terms of long-term stability in the ambient atmosphere owing to the detachment of the dopant. It is therefore essential to develop a facile and efficient method to fabricate stable and superior CNT-TCFs.

Solution to Problem

The present invention was made in view of these circumstances and provides a conductive material, and a conductive film and a solar cell using the same, which are capable of achieving a high-electric conductivity, long-term stability under atmospheric environment, high-temperature stability (thermal resistance), and high humidity stability by allowing PPS acid to be thinly adsorbed on the surface of the CNTs by taking advantages of the structurally stable CNT network structure and chemically stable PSS.

The conductive material of the present invention may include a mixture of carbon nanotubes (CNTs) and polystyrene sulfonic acid (PSS acid).

In the case of the conductive material according to the present invention, the element ratio (S/C ratio) of sulfur (S) to carbon (C) in terms of the number of atoms may be from 0.001 to 0.1.

In the case of the conductive material according to the present invention, CNTs and PSS acid may make up a content percentage of 10 wt % or more in the mixture.

The present invention may provide a conductive film comprised of the conductive material as described hereinabove, wherein the weight per unit area of the CNTs is from 1 $mg/m^2$ to 10000 $mg/m^2$.

The present invention also may provide a solar cell including the conductive film as described hereinabove, wherein the film is on the semiconductor surface thereof.

Advantageous Effects of the Invention

The present invention provides a practical advantage of readily obtaining a conductive material with a simple application of dispersion liquid without removing the dispersant or adding further dopants because the PPS acid has a strong dispersing ability which allows the CNTs to be readily dispersed in the aqueous solution of the PSS acid.

DESCRIPTION OF EMBODIMENTS

Figure 1:
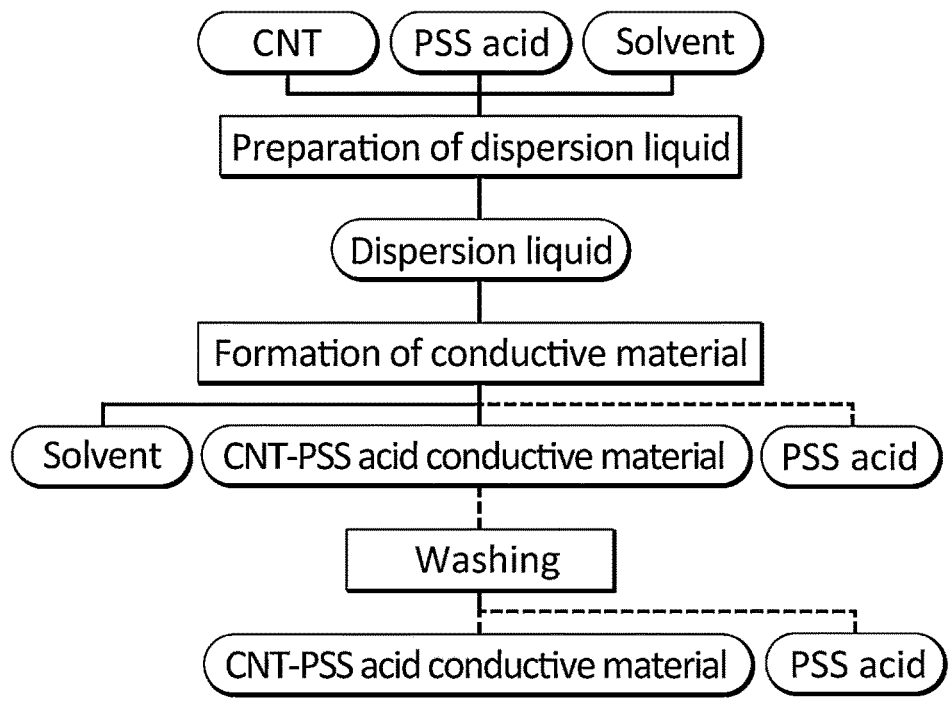
FIG. 1 is a flowchart representing a manufacturing process of a conductive material according to the first embodiment of the present invention.

Based on drawings and working examples, described hereunder are preferred embodiments of a conductive material, and conductive film and solar cell using the same.

The conductive material 6 (see FIGS. 5A to 5E) according to the present embodiment includes a mixture of carbon nanotubes (CNTs) and polystyrene sulfonic acid (PSS acid). Here, the PSS acid functions as a dispersant and a dopant for the CNTs.

The conventional poly(3,4-ethylene dioxythiophene): PSS (or PEDOT: PSS) is a popular organic conductor in which the PEDOT doped as p-type with the PSS acid realizes high electric conductivity. However, the PEDOT gradually agglomerates over time by exposure to water vapor, resulting in poor stability. CNT films are much more stable than the PEDOT, and therefore it is beneficial to employ a method that dopes CNTs into p-type by using the PSS acid.

Although the SDBS has traditionally been used as a dispersant for the CNTs, in the process of preparing CNT films through filtration or application of the CNT dispersion liquid, the SDBS remains in the films and inhibits electric conductivity between the CNTs, which therefore necessitates removal processing of the SDBS by hot water or nitric acid. It has also been conventional to perform dope processing in the CNT films for further enhancement of their electric conductivities. Meanwhile, since the PSS acid or polystyrene sulfonates have a high dispersion effect due to the fact that they are alkyl benzene sulfonates as is the case of the SDBS, and also work directly as dopants, there requires no removal process of the PSS acid from the CNT films nor any doping processing for incorporating the PSS acid, which therefore contributes to achievement of a conductive material 6 by such an efficient process.

The dispersing/thin-film forming process with the PSS acid aqueous solution 2 may therefore be applied to manufacture a conductive material that is excellent in terms of high-electric conductivity, long-term stability, and heat and high-humidity stabilities without performing any additional acid treatment or doping. Particularly, PSS acid aqueous solution 2 and the repetitive dispersion-extraction process as explained hereinabove may be combined with each other to process virtually the full amount of CNT powder into a sophisticated conductive material 6. Further, the CNT thin films can be made from the CNT dispersion liquid to manufacture a conductive material 6 that is also excellent in light transparency The conductive material 6 according to the present embodiment may be a conductive film 7 having the shape of a thin film, or a conductive wire having the shape of a wire. The conductive film 7 and the conductive wire may be distinguished from each other by, for example, their aspect ratios. For example, when a dimension of the conductive material 6 along the direction of the smallest dimension is defined as x, and a dimension thereof that is orthogonal to the direction of x and smallest of all is defined as y, the conductive material 6 having an aspect ratio y/x of 10 or more may particularly be referred to as a conductive film 7. Further, when a dimension of the conductive material 6 along the direction of the smallest dimension is defined as x, and a dimension thereof that is orthogonal to the direction of x and smallest of the all is defined as y, and a dimension along the direction that is orthogonal to the directions of both x and y is defined as z, the conductive material 6 having aspect ratios z/x and z/y of 10 or more for both of the z/x and z/y may be referred to as a conductive wire.

SDBS, PVA, sodium dodecyl sulfate (SDS), sodium cholate (SC), PSS sodium salt and the like, which have been traditionally used as dispersants, are strongly adsorbed onto the CNTs and exhibit dispersing effect but they exhibit virtually no effect as a dopant for improving electric conductivity of the CNTs. The PPS acid of the present embodiment not only has a characteristic as an effective dispersant but also has its function as an effective dopant.

PEDOT: PSS that has conventionally been utilized as an antistatic agent, a hole-injecting layer for the organic EL or solar cells, or a transparent conductive film may be applied to the surface of an n-type silicon substrate for the easy manufacturing of the solar cells. However, as mentioned hereinabove, the PEDOT: PSS is weak in humidity and aggregates upon water absorption, thereby disrupting the PEDOT network, which deteriorates the functionality of the solar cells over time. In contrast to this, the conductive film 7 (CNT film doped with PSS acid) according to the present embodiment may be present on the surface of a semiconductor for manufacturing long-life solar cells.

The conductive material 6, as well as the conductive film 7 formed of the conductive material 6 according to the present embodiment, has a mixing ratio of the PSS acid and the CNTs which is appropriately adjusted. The element ratio (S/C ratio) of sulfur to carbon in terms of the number of atoms may be from 0.001 to 0.1; for example, it is preferred that such element ratio be from 0.003 to 0.1, more preferably from 0.01 to 0.1. The element ratio of less than 0.001 gives rise to the deficiency in doping effect from the PSS acid to the CNTs and leads to little improvement in electric conductivity. The element ratio exceeding 0.1 gives rise to an excess of the PSS acid serving as an insulating material, which in turn makes the conductive material 6 and the conductive film 7 highly resistive.

The conductive material 6, as well as the conductive film 7 formed of the conductive material 6 according to the present embodiment, may be a mixture of CNT-PSS acid with further components added thereto. The CNTs and the PSS acid may make up a content percentage of 10 wt % or more in the mixture, which is preferably 30 to 100 wt %, more preferably 50 to 100 wt % in the mixture, for example. The conductive material 6 formed of the CNT-PSS acid film often has 50 to 90% of porosity in terms of volume fraction, and further components may be added thereto to fill the porosity so as to add functionality for the further components without impairing the electrical conductivity thereof. The content percentage less than 10 wt % inhibits the network between CNTs, which potentially lowers electric conductivity thereof. Note that the above-mentioned numerical values refer to the ratio of the further components in the composite films, and the further components may be additionally present outside of the composite films. For example, according to an example of the solar cells, Nafion may be coated on the CNT-PSS acid films to improve their functionality. It may be provided that Nafion not only fills porosities of the conductive material 6 but also forms a layer exclusively of Nafion outside the porosities to thereby provide an antireflection functionality.

According to the conductive film 7 comprised of the conductive material 6 according to the present embodiment, the weight per unit area of the CNTs may be from 1 $mg/m^2$ to 10000 $mg/m^2$. A weight per unit area of the CNTs in the range from 1 to 10 $mg/m^2$ allows fabrication of transparent conductive films having visible light transmission of 85 to 98%. Meanwhile, a weight per unit area of the CNTs in the range from 10 to 100 $mg/m^2$ allows the fabrications of semitransparent and flexible conductive films. Further, a weight per unit area of the CNTs in the range from 100 to 10000 $mg/m^2$ allows fabrications of conductive films that are opaque and of small sheet resistance which are suitable for sheet heaters. A weight per unit area of the CNTs less than 1 $mg/m^2$ is insufficient for forming the networks of CNTs, and therefore results in a highly resistive film. Meanwhile, a weight per unit area of the CNTs larger than 10000 $mg/m^2$ potentially leads to an increase in cost for the CNTs and PSS acid and also leads to a reduction in adherence to the substrates of the CNT-PSS acid films.

The conductive films 7 (PSS acid-doped CNT films) according to the present embodiment may be utilized, for example, for a transparent heater formed with line-shaped patterns or for the wiring for a flexible printed circuit board, and an aperture ratio thereof may be appropriately set.

The conductive material 6 as a mixture of the present embodiment may contain a further component for controlling the density, refractive index, mechanical strength, and adhesiveness to the substrate. As examples of such further components, various types of polymer binders or ion-exchange resins may be used for it.

The PSS acid according to the present embodiment is not in a form of a compound such as PSS sodium salt or PSS esters but rather in an acidic state with a group of $-SO_3H$. As is the case for nitric and chlorosulfonic acids which are excellent p-type dopants for the CNTs, the PSS acid may also be used as an excellent dopant that directly functions as a dispersant which does not require any removal of the PSS acid after dispersing them, thereby achieving an efficient manufacturing process of the conductive material 6 and conductive films 7. Alternatively, salts such as the PSS sodium salt may be used as a dispersant to disperse the CNTs for forming the CNT-PSS acid salt complex, which is then treated with a strong acid for turning the PSS salt into an acidic state to thereby manufacture the conductive material 6 and the conductive films 7. In some cases, the PSS acid esters may be used as a dispersant to disperse the CNTs for forming the CNT-PSS acid ester complex after which the PSS ester may undergo hydrolysis to reach an acidic state to manufacture the conductive material 6 and the conductive films 7.

First Embodiment

FIG. 1 represents a schematic diagram of the manufacturing process of conductive material 6 and conductive films 7 comprised of the conductive material 6 according to a first embodiment of the present invention.

First of all, CNT agglomerates 1, PSS acid, and a solvent are added to a container to prepare a dispersion liquid, where the PSS acid is dissolved and the CNTs are dispersed in the solvent. A suitable solvent includes water and monohydric or polyhydric alcohols. The CNT agglomerates, the PSS acid, and the solvent may be agitated in the container for dispersing the CNTs and dissolving the PSS acid. Further, ultrasonic dispersion, bead mills, ball mills, jet mills, or any other various dispersion techniques may be applied therefore. Alternatively, the PSS acid may be dissolved beforehand in the solvent to which the CNT agglomerates may then be added and dispersed.

The solvent is then removed from the dispersion liquid to manufacture a CNT-PSS acid conductive material 6. For example, a membrane filter 5 may be used for the filtering to remove the solvent to obtain a film-shaped CNT-PSS acid conductive material 6 on the filter 5 for manufacturing the CNT-PSS acid conductive film 7. Also, the CNT-PSS acid conductive material 6 may be isolated from the membrane filter 5 for obtaining the CNT-PSS acid conductive material 6 as an independent film. Further, the CNT-PSS acid conductive material 6 may be transferred from the membrane filter 5 to a substrate.

In some cases, the dispersion liquid may be applied to any substrate using, for example, blade coating, bar coating, or spray coating and then dried to obtain the CNT-PSS acid conductive material 6 in a form of the film for manufacturing the CNT-PSS acid conductive film 7. Alternatively, the dispersion liquid in a poor solvent of, for example, organic solvent may be discharged through a nozzle to obtain a CNT-PSS acid conductive material 6 in a form of wire for manufacturing a CNT-PSS acid conductive wire. Furthermore, the dispersion liquid may be freeze-dried to obtain a CNT-PSS acid conductive material 6 in a form of a sponge. It is to be noted that a part of the PSS acid may be removed by, for example, washing in a subsequent process for adjusting the CNT/PSS acid ratio in the CNT-PSS acid composite material. It is more preferable to employ filtration in a method of manufacturing the CNT-PSS acid conductive material 6 since there can be omitted a washing process because an excessive PSS acid is removed once a CNT-PSS acid conductive material 6 has been prepared.

Second Embodiment

Figure 2:
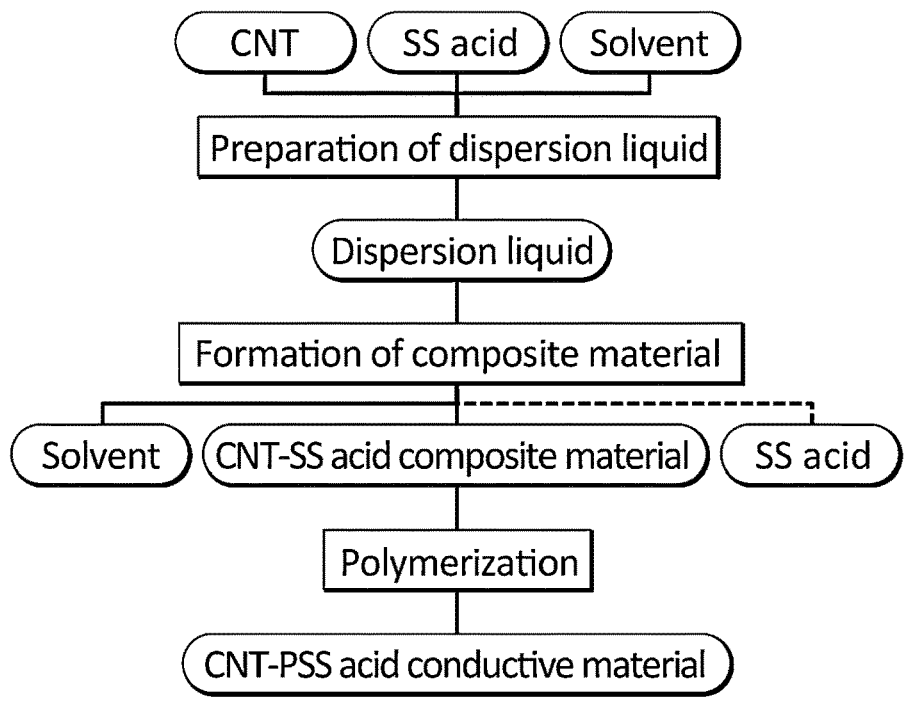
FIG. 2 is a flowchart representing a manufacturing process of a conductive material according to the second embodiment of the present invention.

A second embodiment of the present invention will be described with reference to FIG. 2 in which styrenesulfonic acid (SS acid) is used in place of the PSS acid in the method of the first embodiment for manufacturing the conductive material 6.

The CNTs, the SS acid, and a solvent are provided to prepare a dispersion liquid from which the solvent is then removed to make a CNT-SS acid composite material. After that, the SS acid is then polymerized to obtain a CNT-PSS acid conductive material 6.

Third Embodiment

Figure 3:
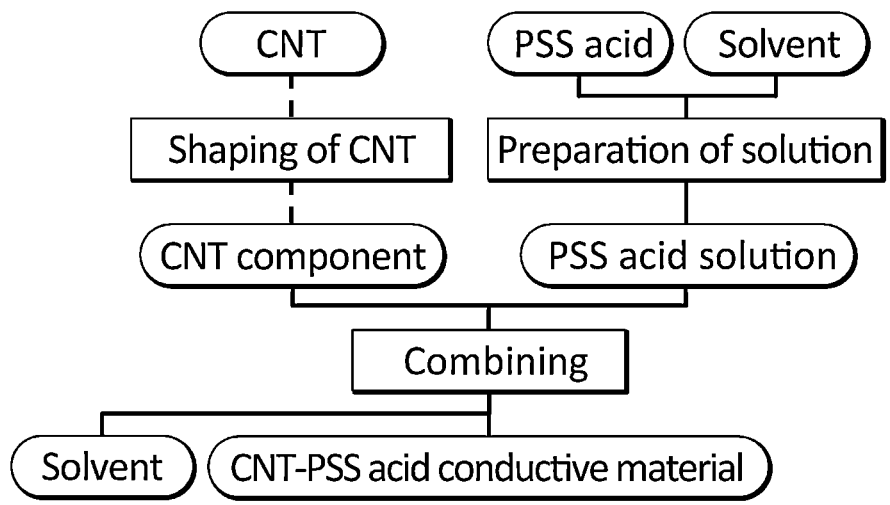
FIG. 3 is a flowchart representing a manufacturing process of a conductive material according to the third embodiment of the present invention.

A third embodiment of the present invention will be described with reference to FIG. 3 in which there are provided CNT components, prepared in a variety of methods and having a shape of, for example, film, patterned film, wire, or sponge, and the PSS acid solution where the PSS acid is dissolved in a solvent, and then the CNT components and the PSS acid solution are combined, and the solvent is removed for manufacturing a CNT-PSS acid conductive material 6.

In the case where film-shaped CNT components are used, the film-shaped CNT components may be made by a wet process, such as dispersion or coating, or by a dry process where the CNTs produced by means of the FCCVD are collected on a filter or substrate. The CNT components in a shape of the patterned film may be those formed by etching the film-shaped CNT components, or those made by pattern-printing the CNT dispersion liquid thereon, or those made by pattern-collecting the CNTs synthesized by mean of the FCCVD. The wire-shaped CNT components may be those made by wet spinning them from a CNT dispersion liquid, or those made by dry spinning them from a vertically-oriented CNT film synthesized on a substrate, or those made by dry spinning them from CNT flocculent agglomerates synthesized by means of the FCCVD. The sponge-like CNT components may be those obtained from CNT agglomerates synthesized by means of the FCCVD, or those obtained by, for example, freeze-drying the CNT dispersion liquid.

Forth Embodiment

Figure 4:
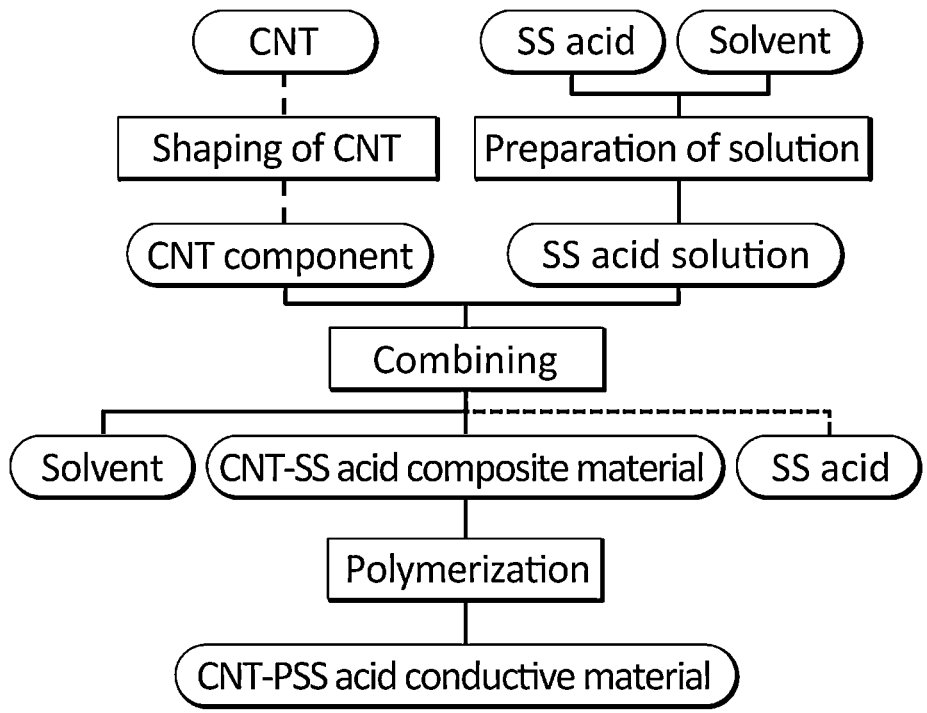
FIG. 4 is a flowchart representing a manufacturing process of a conductive material according to the fourth embodiment of the present invention.

A fourth embodiment of the present invention will be described with reference to FIG. 4 in which there are provided CNT components, prepared in a variety of methods and having a shape of, for example, film, patterned film, wire, or sponge, and the SS acid solution where the SS acid is dissolved in a solvent, and then the CNT components and the SS acid solution are combined, and then the solvent is removed for manufacturing a CNT-SS acid conductive material 6. After that, the SS acid is polymerized to manufacture the CNT-PSS acid conductive material 6

The conductive material 6 of the present invention may contain not only the CNTs and the PSS acid but also further components. Specifically, a binder contained on top of the CNTs and the PSS acid is preferable because it allows the conductive material to improve its mechanical strength or durability. Further, a transparent component contained on top of the CNTs and the PSS acid is preferable because it allows the conductive material to control its density or refraction index. Alternatively, the polystyrene sulfonates such as salts or esters of the PSS acid may be contained therein in addition to the CNTs or PSS acid. In these circumstances, the corresponding components may be contained beforehand in the CNT dispersion liquid, or the components may be added thereto after the CNT-PSS acid conductive material 6 has been prepared. Alternatively, water may be added thereto on top of the CNTs and the PSS acid. Although the PSS acid is hydrophilic, and thus potentially absorbs moisture in the atmosphere, the CNT-PSS acid conductive material is stable in the presence of moisture, and therefore works well without implementing a countermeasure for preventing absorption or removal of the moisture.

Working Examples

All documents referred to herein are incorporated herein by reference in their entirety. The examples described herein are exemplary of embodiments of the invention and should not be construed as limiting the scope of the invention.

Explained hereunder are CNT films 7 doped with the PSS acid which are prepared as embodiments of the present invention as well as their evaluation results.

<Dispersion/Film-Forming Process of CNTs in PSS Acid Aqueous Solution>

The dispersion/film-forming process of the CNTs was carried out in this embodiment as schematically illustrated in FIGS. 5A to 5E as an example of the dispersion/film-forming process of the CNTs. 1 mg of CNT agglomerates 1 produced by the FCCVD (MEIJO eDIPS, EC grade, Meijo Nano Carbon Co., Ltd., Nagoya, Japan) were dispersed in 30 mL of PSS acid aqueous solution 2 (poly(p-styrene-sulfonic acid), 2 wt %, Wako, Tokyo, Japan). The dispersion was stirred vigorously for 2 hours for dispersing the CNTs in the PSS acid aqueous solution 2, and then sonicated in a bath-type sonicator (VS-50R, VELVO-CLEAR, Tokyo, Japan) for 0-60 minutes. After being sonicated, it was subjected to centrifugation at 4000 rpm for 10 minutes. The supernatant 3 was used for the subsequent process of film fabrication via vacuum filtration, and the sediment 4 was used for the dispersion process in the subsequent cycle.

<Fabrication of CNT Films Doped with PSS Acid>

The CNT films 7 doped with the PSS acid were fabricated by a vacuum filtration method. 50-200 μL of the CNT dispersion liquid and 15 mL of deionized water were mixed and vacuum filtrated onto a hydrophilic cellulose-ester membrane filter 5 (VCWP, 0.1 μm pore diameter, Merck Millipore, Darmstadt, Germany). The thickness of the CNT films 7 doped with the PSS acid was controlled by varying the filtration amount of the suspensions. A membrane filter 5 was then carefully dipped into deionized water before the film got dry. The film 7 was separated from the membrane filter 5 and floated on the water. The film 7 was then transferred onto the substrates of polyethylene terephthalate (PET) film (38 μm of thickness, Teijin Film Solution Limited, Tokyo, Japan), quartz glass, or Si. The films on substrates were finally dried on a hot plate at 70° C. for 10 minutes.

Comparative Examples

PEDOT: PSS films, and CNT films doped with nitric acid ($HNO_3$) were also fabricated as comparative examples. The PEDOT: PSS films were formed by spin-coating the PEDOT:PSS (500 S/cm, Heraeus Deutschland GmbH & Co. KG, Leverkusen, Germany) solution at 2000 rpm for 1 minute and successive annealing at 135° C. for 10 minutes.

The CNT films doped with $HNO_3$ were fabricated via the dispersion of CNTs in the SDBS aqueous solution, vacuum filtration, and doping by dipping them in concentrated nitric acid for 1 minute.

<Evaluation Method>

The concentration of CNTs in the supernatant 3 was determined by measuring the optical absorbance, using ultraviolet-visible spectrophotometry (UV-vis; V-630, JASCO, Tokyo, Japan), and by implementing calibration curves.

The transmittance of the films was measured by ultraviolet-visible (UV-vis) spectroscopy at 550 nm, and the sheet resistance was measured by the four-point probe method.

The films of the working examples were observed using a scanning electron microscope (SEM; S-4800, Hitachi High-Tech, Tokyo, Japan) and transmission electron microscope (TEM; JEM-2100F, JEOL, Akishima, Japan).

Raman and XPS spectra of the films of the working examples were respectively observed by using a micro-Raman spectroscopy device (HR-800, Horiba, Kyoto, Japan) and X-ray photoelectron spectroscopy devise (XPS; JPS-9010TR, JEOL, Tokyo, Japan). The Raman spectra were measured by using an excitation laser wavelength of 488 nm. The crystalline nature of CNTs can be analyzed by means of laser micro-Raman spectroscopy. The peak that appears near 1590 $cm^{-1}$ is referred to as the G-band which originates from the in-plane stretching vibration mode of the carbon atoms of the six-membered ring structures. The peak located at near 1350 $cm^{-1}$ is referred to as the D-band which appears more frequently with the presence of defects in the six-membered ring structures. The crystalline nature of CNTs in relative terms can be evaluated using the peak intensity ratio $I_G/I_D$ of G band to D band (G/D ratio). CNT having a higher G/D ratio is evaluated as being of higher crystallinity. The peak located at near 200 $cm^{-1}$ is referred to as RBM (Radial Breathing Mode) which is unique to single-walled carbon nanotubes (SWCNTs) and corresponds to a mode that vibrates in the radial direction of the tube.

Furthermore, the films in the working and comparative examples were kept under ambient condition for 1 to 1000 hours after which the sheet resistances were measured for examining their long-term stability.

The high-temperature stability was investigated by measuring the sheet resistance of these films of the working and comparative examples after heating them at 25 to 200° C. for 10 minutes by a hot plate.

High-humidity stability was also investigated by measuring the sheet resistance of these films of the working and comparative examples after keeping them under high humidity conditions at 85° C. for 1 to 100 hours.

<Evaluation Results>

Figure 5:
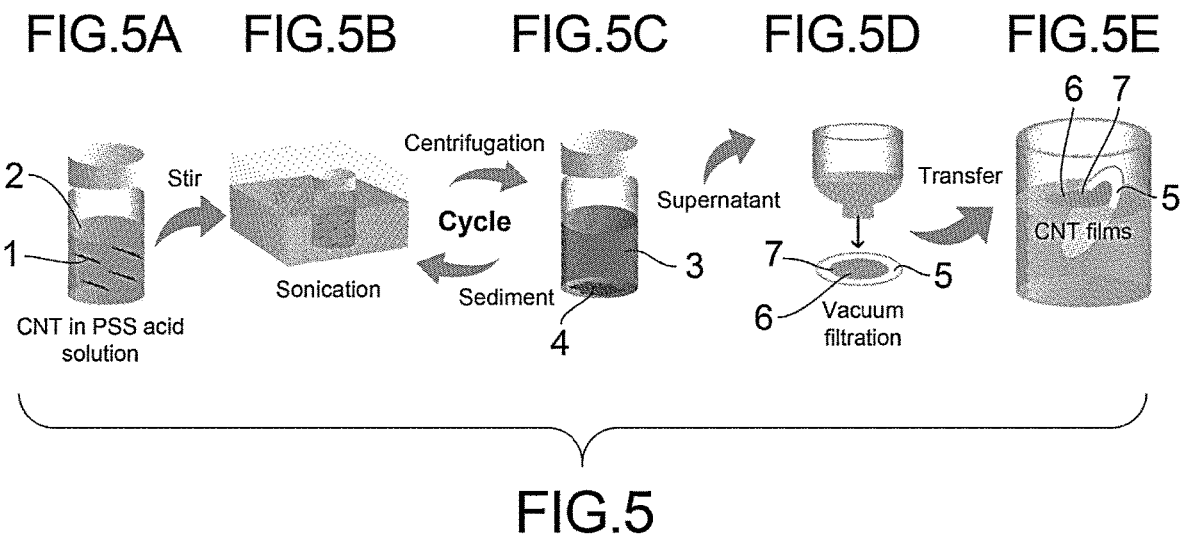
FIGS. 5A to 5E are schematic drawings representing an example of a manufacturing process of a conductive material according to the first embodiment of the present invention.
Figure 6:
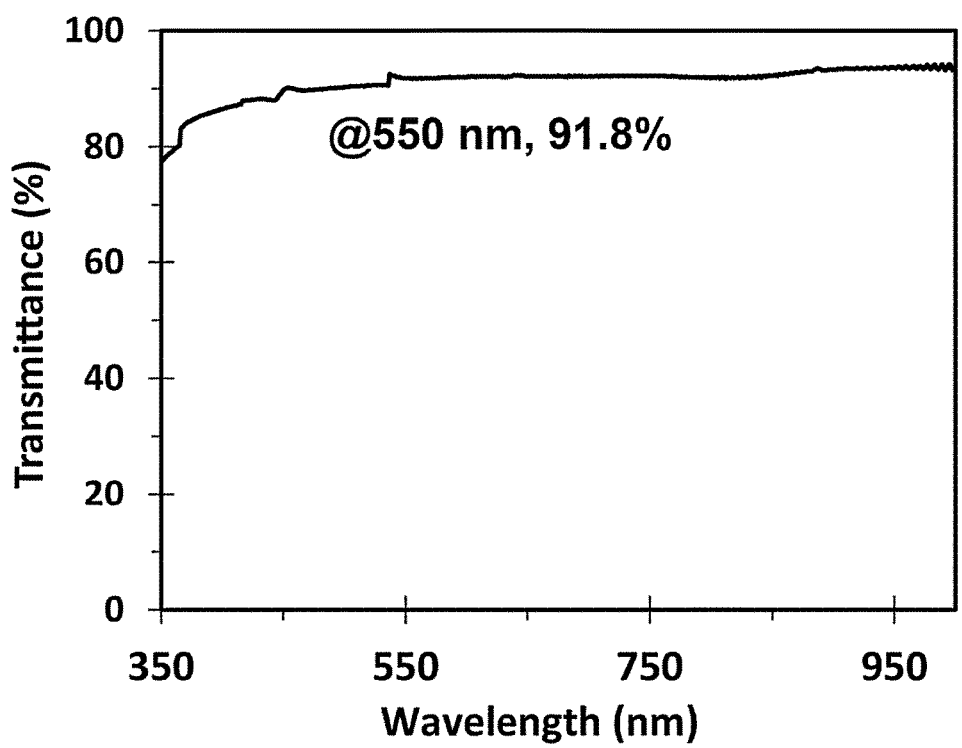
FIG. 6 is a graph that shows transmittance spectra for the CNT film doped with the PSS acid according to the present invention.
Figure 7:
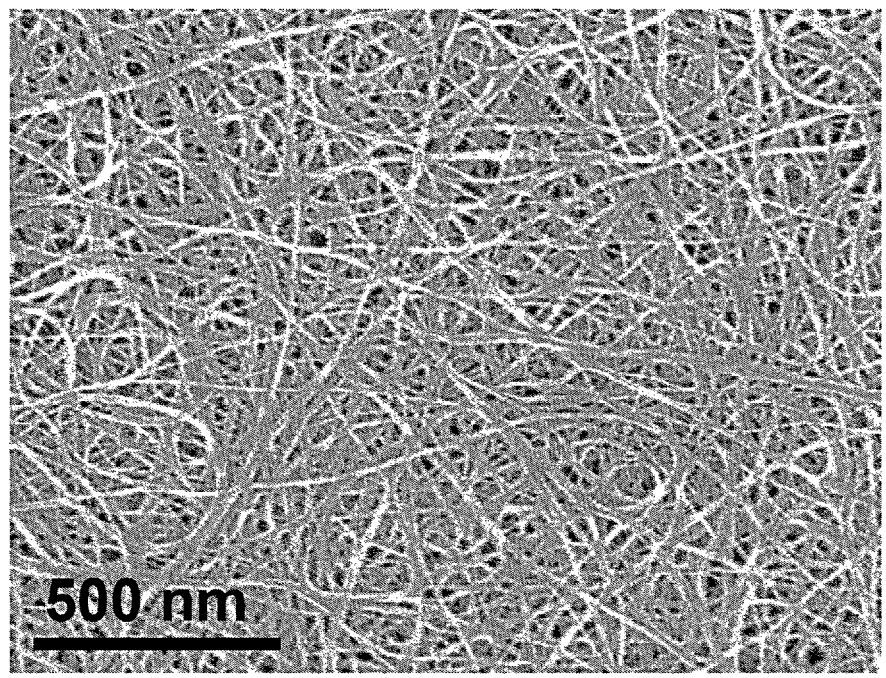
FIG. 7 is an SEM image of the CNT film doped with the PSS acid according to the present invention.

The CNTs were dispersed in a PSS acid aqueous solution 2 by the dispersion/film-forming method as explained hereinabove (FIG. 5). The PSS acid showed excellent performance as a dispersant for the CNTs in water, achieving partial dispersion of the CNTs just by stirring. After the ultrasonication of the CNT-PSS acid aqueous solution, a darker solution with increased content of the dispersed CNTs was obtained. FIG. 6 shows the transmittance spectra for the CNT films 7 doped with the PSS acid, showing high transparency of 91.8% at 550 nm. The SEM image in FIG. 7 shows a random network of CNT bundles without agglomerates. It also indicated usability of the repetitive process in the dispersion/film-forming process for enabling the production of the conductive material 6 and films 7 of high-quality using the supernatant 3 while allowing the recycled use of the sediment 4 in the dispersion liquid as CNT agglomerates 1.

Figure 8:
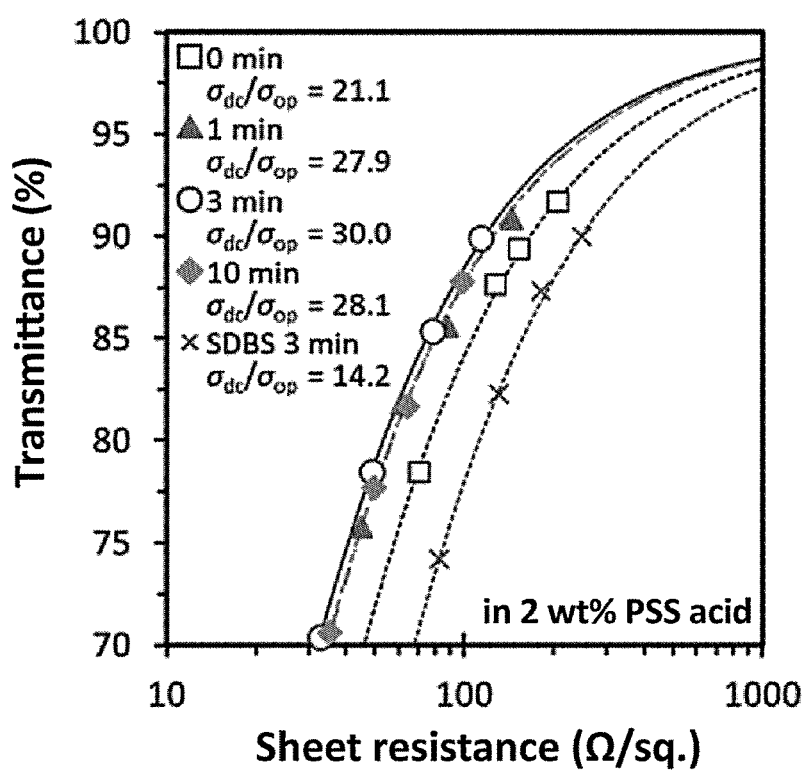
FIG. 8 is a graph that shows measurement results for optical transmittances and sheet resistances of the CNT films that underwent sonification processes for 0 to 10 minutes in 2 wt % PPS acid aqueous solution according to working examples of the present invention and comparative examples.

Dispersion conditions, including sonication time and PSS acid concentration, were varied to investigate the optimal condition of dispersion. First, PSS acid concentration was fixed at 2 wt % while changing the sonication time per cycle from 0 to 60 minutes. Then, optical transmittance and sheet resistance of the CNT films from different dispersion conditions were investigated (FIG. 8). As a comparative example, CNT films without doping were also fabricated by dispersing the CNTs in 0.5 wt % SDBS aqueous solution.

In the case where no sonication was performed (just by stirring CNTs in the PSS acid aqueous solution 2), the CNT films doped with PSS acid showed a conductivity higher than that of the undoped CNT films which were fabricated by sonication in the SDBS solution. In the case where sonication was performed, the sheet resistance decreased, and low sheet resistances of 115 and 49 Ω/sq at respective transmittances of 90% and 79% were obtained for the CNT films 7 that are doped with the PSS acid and subjected to sonification for 3 minutes. Further increase in sonication time to 10 minutes or more resulted in decreased conductivity due to the increased damage to the CNTs. The CNT film collected on the membrane filter by sonication time extended to 60 minutes could not be easily separated from the filter upon immersion in water.

Figure 9:
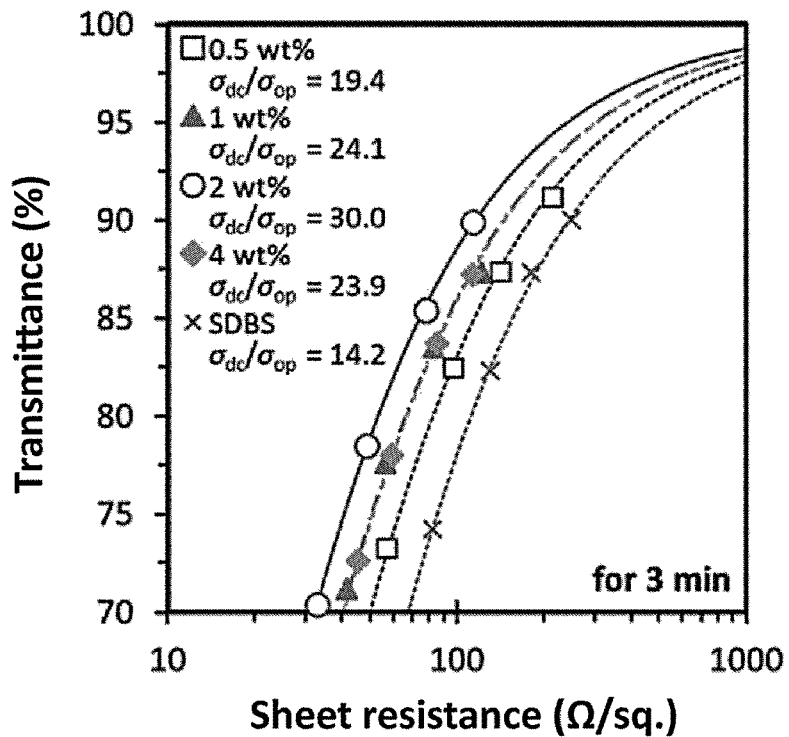
FIG. 9 is a graph that shows measurement results for optical transmittances and sheet resistances of the CNT films that underwent sonification processes for 3 minutes in aqueous solutions of various PSS acid concentrations ranging from 0.5 to 4 wt % according to working examples of the present invention and comparative examples.

Therefore, the sonication time was fixed at 3 minutes in the experiment while changing the PSS acid concentration from 0.5 to 4 wt % (FIG. 9). The conductivity was improved with the increase of the PSS acid concentration, but the excess concentration of the PSS acid resulted in poor conductivity because direct junction established between the CNTs or CNT bundles was impeded by the excess of the PSS acid.

The performance of transparent conductive films is usually evaluated by the ratio of electrical conductivity ($\sigma_{dc}$) to optical conductivity ($\sigma_{op}$):

$$T = \left(1 + \frac{1}{2R_S}\sqrt{\frac{\mu_0}{\varepsilon_0}}\frac{\sigma_{op}}{\sigma_{dc}}\right)^{-2} \quad (1)$$

where T is optical transmittance, $R_S$ is sheet resistance, $\mu_0 = 4\pi \times 10^{-7}$ N A$^{-2}$ and $\varepsilon_0 = 8.854 \times 10^{-12}$ C$^2$ N$^{-1}$ m$^{-2}$ are the permeability and permittivity of free space, respectively.

The ratio of $\sigma_{dc}/\sigma_{op}$ quantifies the combined electrical and optical quality, so the higher values of $\sigma_{dc}/\sigma_{op}$ indicate better performance of the transparent conductive films (TCFs). With the condition of 3 minutes sonication in 2 wt % PSS acid aqueous solution 2, CNT films 7 doped with the PSS acid showed the highest $\sigma_{dc}/\sigma_{op}$ ratio of 30 which is comparable to those that used strong acid doping. The resultant CNT films doped with PSS acid exhibited a higher conductivity compared to the CNT films not treated with the PSS acid irrespective of the cases where they are treated with the PSS acid aqueous solution of any one of the concentrations ranging from 0.5 to 4 wt %.

Figure 10:
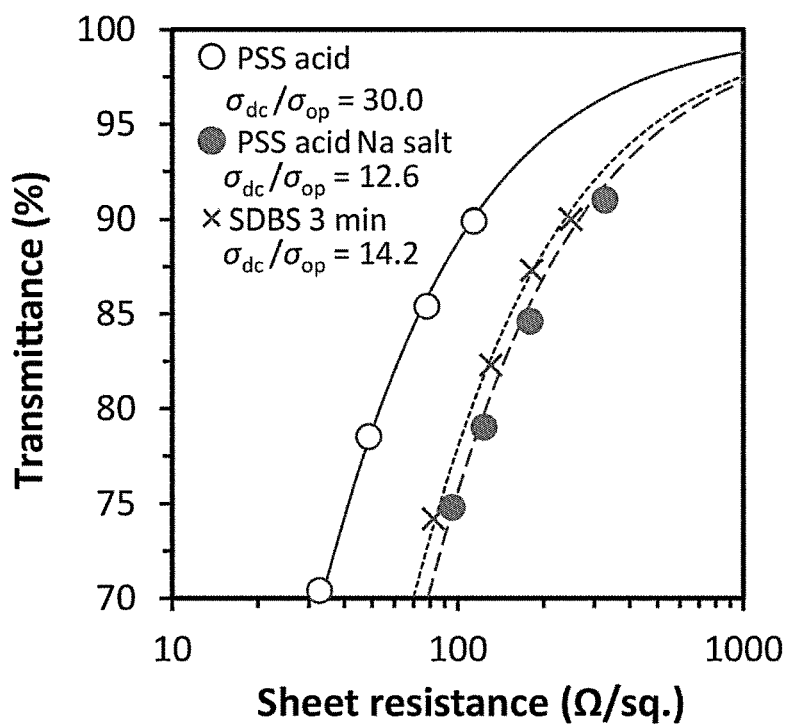
FIG. 10 is a graph that shows the $\sigma_{dc}/\sigma_{op}$ ratio for the case where the PSS acid is employed for dispersing the CNTs in comparison with the case where the PSS sodium salt is employed therefore.

PSS acid is used in this embodiment. FIG. 10 shows the results where PSS acid is used for dispersing the CNTs compared to the cases where PSS sodium salt is used for dispersing the CNTs. The CNT films fabricated using PSS sodium salt showed a $\sigma_{dc}/\sigma_{op}$ ratio of 12.6, much lower than those fabricated using PSS acid ($\sigma_{dc}/\sigma_{op}=30.0$) according to the present embodiment, and even lower than the CNT films 7 fabricated using SDBS ($\sigma_{dc}/\sigma_p=14.2$) according to the comparative embodiment. This result shows the superior doping performance of the PSS acid.

Figure 11:
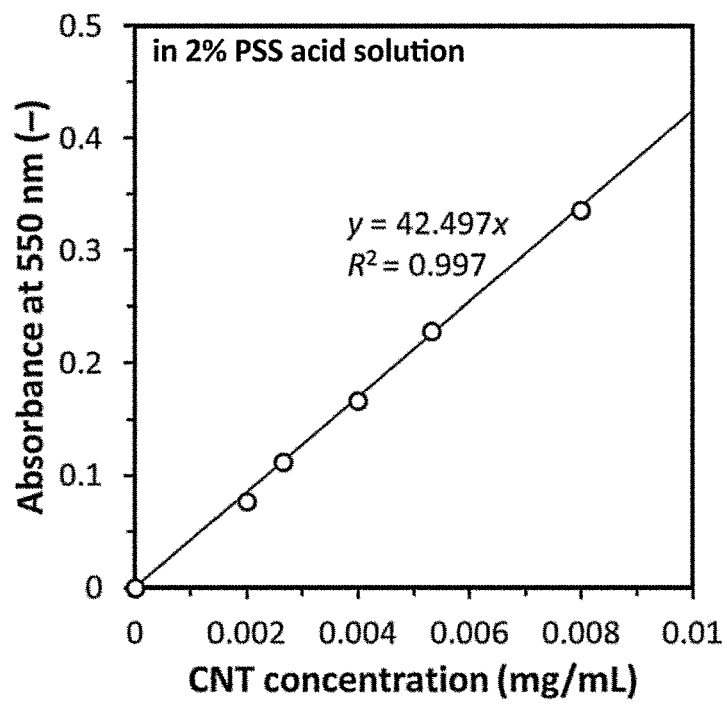
FIG. 11 is a calibration line for calculating the dispersion ratio of the CNTs according to the absorption of the CNTs suspension.
Figure 12:
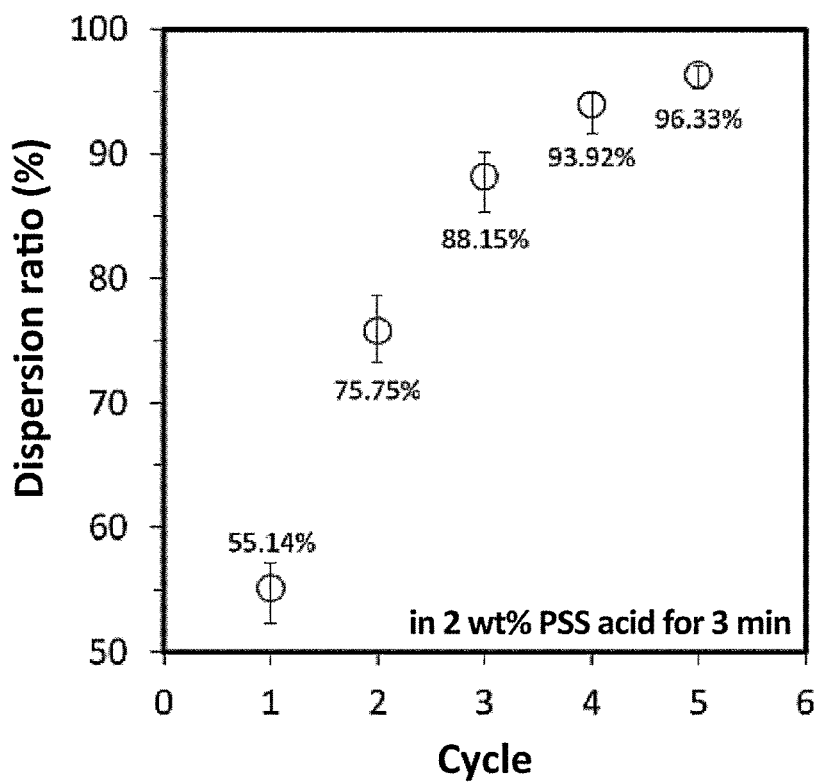
FIG. 12 is a graph indicating a dispersion ratio of the CNTs when the sonication is processed for 3 minutes in 2 wt % PSS acid aqueous solution.

Moreover, the dispersion ratio in accordance with the absorbance of the CNT suspension is calculated (see FIG. 11). The dispersion ratio of the CNTs shows the proportion of the CNTs extracted to the supernatant 3 with respect to the raw agglomerates 1. By sonicating 2 wt % PSS acid solution for 3 minutes, the CNT agglomerates 1 were dispersed almost completely (approximately 90%) within 4 cycles (FIG. 12). PSS acid showed excellent performance in both dispersion and doping of the CNTs.

Figure 13:
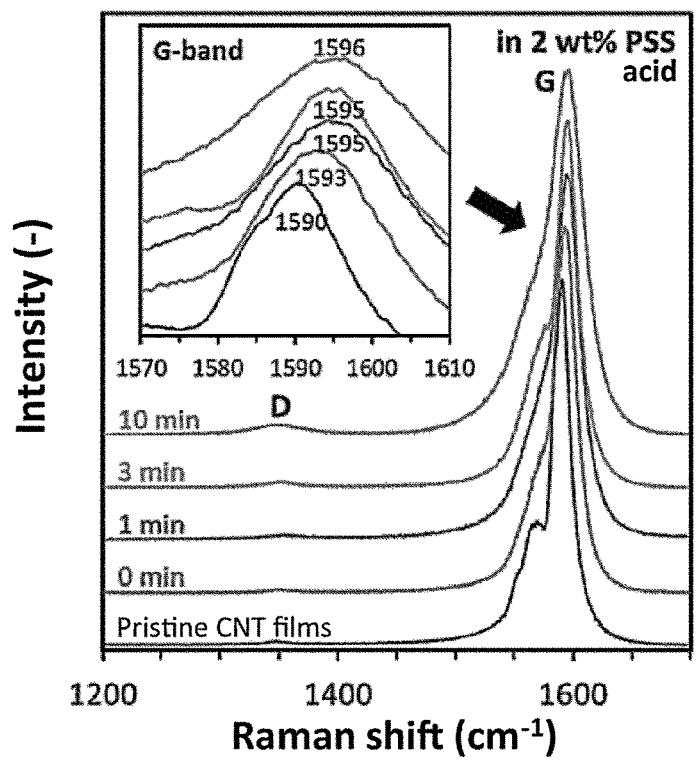
FIG. 13 is a graph that shows Raman spectra of the CNT films that underwent sonification processes for 0 to 10 minutes in 2 wt % PSS acid aqueous solution according to working examples of the present invention and comparative examples.
Figure 14:
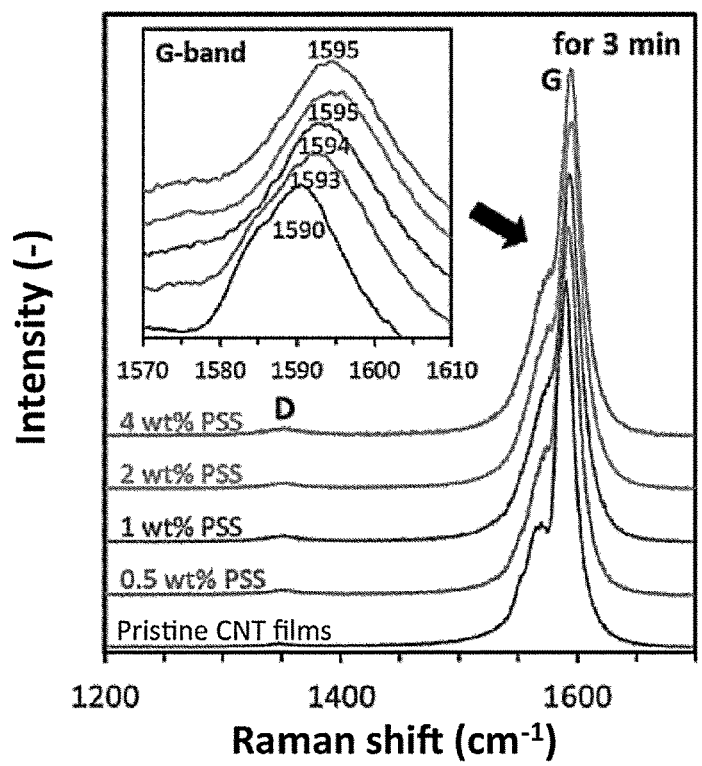
FIG. 14 is a graph that shows Raman spectra of the CNT films that underwent sonification processes for 3 minutes in aqueous solutions of various PSS acid concentrations ranging from 0.5 to 4 wt % according to working examples of the present invention and comparative examples.
Figure 15:
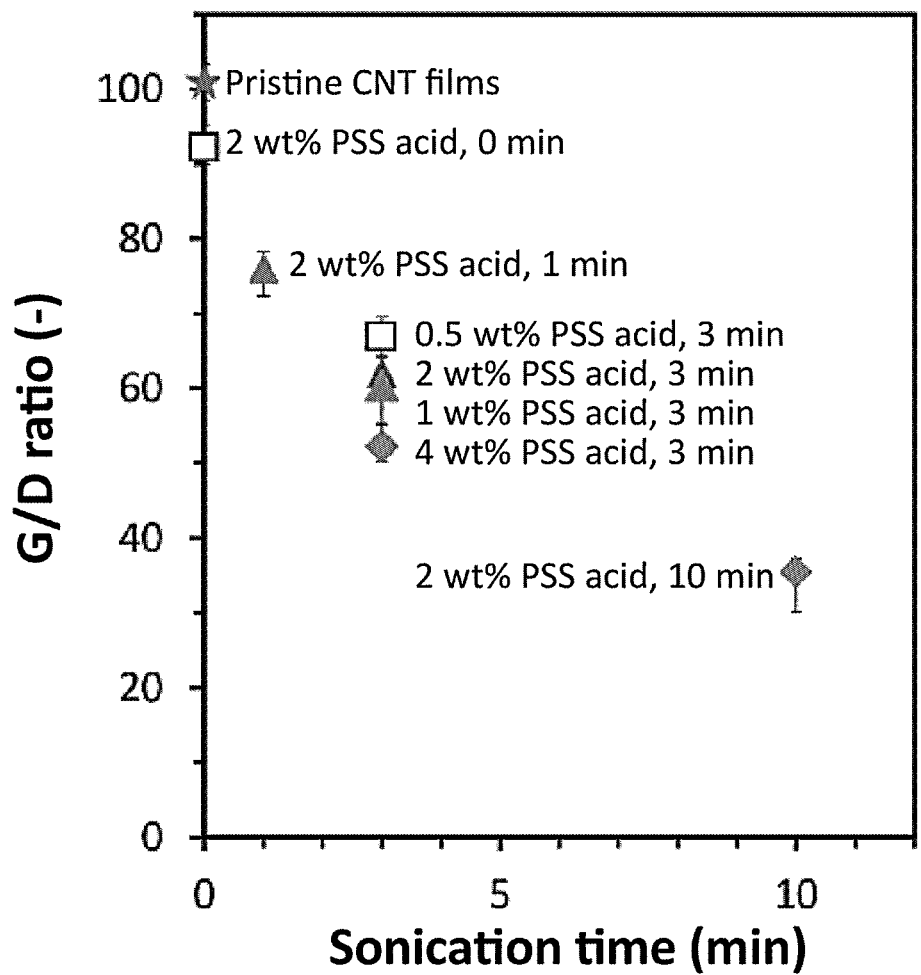
FIG. 15 is a graph summarizing the peak intensity ratios of the G-band to D-band (G/D) of the CNT films according to the working and comparative examples.

To better understand the doping level in detail, the sonication effect on the quality of the CNTs was investigated by Raman scattering spectroscopy. FIGS. 13 and 14 show the Raman spectra of the CNT films prepared using different CNT dispersions, and FIG. 15 summarizes the peak intensity ratios of the G-band to D-band (G/D) of all the CNT films.

Without sonication (0 minutes), the CNT films showed a very weak D-band peak with a high G/D ratio of approximately 90, which is similar to the pristine CNT agglomerate 1. It indicates that the PSS acid enabled the dispersion of CNTs without damaging the CNTs. With increasing time for sonication from 1, 3, to 10 minutes, the D band peak got pronounced and the G/D ratio decreased to approximately 70, approximately 60, and approximately 30, showing the increased damage to the CNTs. In contrast, for a fixed sonication time of 3 minutes, by changing the concentration of the PSS acid, the G/D ratio remained almost unchanged at 55 to 65. These results show that the damage to CNTs was mainly due to the sonication rather than the PSS acid.

The G-band peak shifts are possibly caused by the charge transfer between the dopants and the CNTs. The G-band shifted to higher wavenumbers with increasing sonication time, indicating the enhanced p-type doping with electron transfer from CNTs to the PSS acid possibly via de-bundling of CNTs and wrapping of the de-bundled CNTs by the PSS acid. With the 10 minutes sonication, the CNT films exhibited a large upshift from 1590 to 1596 cm$^{-1}$ in G-band. However, the efficient doping with 10 minutes of sonication was accompanied by significant damage to the CNTs (G/D of approximately 30).

Figure 16:
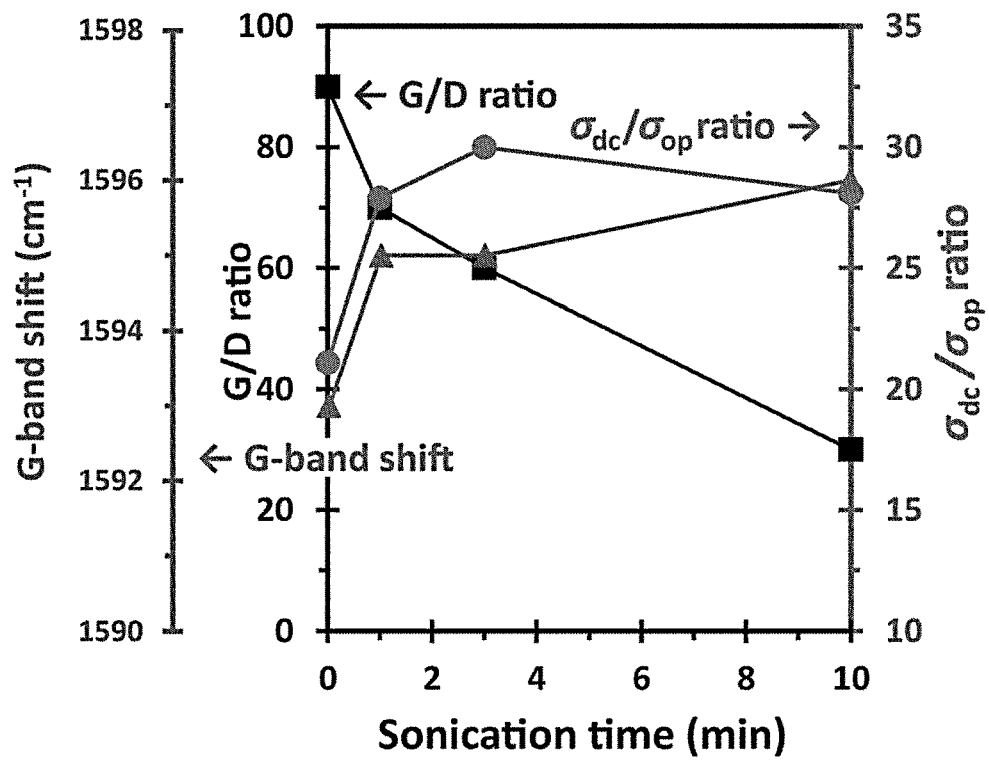
FIG. 16 is a graph showing the G/D ratio, G-band shift, and $\sigma_{dc}/\sigma_{op}$ ratio of the CNT films that underwent sonification processes for 0 to 10 minutes in 2 wt % PSS acid aqueous solution according to working examples of the present invention and comparative examples.
Figure 17:
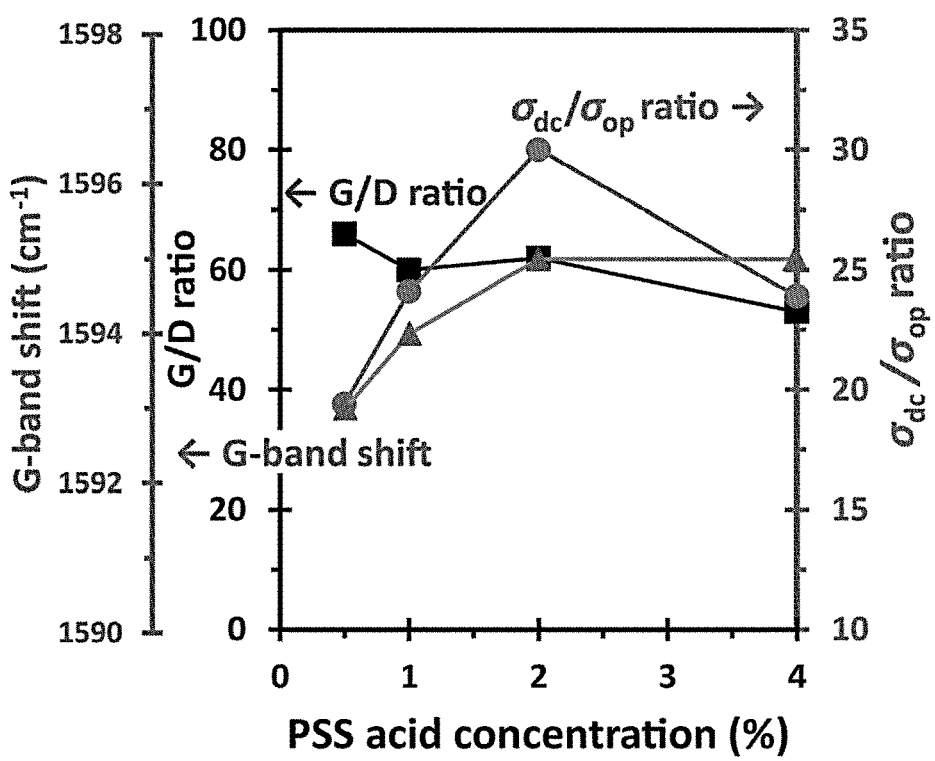
FIG. 17 is a graph showing the G/D ratio, G-band shift, and $\sigma_{dc}/\sigma_{op}$ ratio of the CNT films that underwent sonification processes for 3 minutes in aqueous solutions of various PSS acid concentrations ranging from 0.5 to 4 wt % according to working examples of the present invention and comparative examples.

FIGS. 16 and 17 summarize the quality of the CNT films prepared with different dispersion conditions. The G/D ratio indicates the degree of damage to the CNTs, the G-band shift shows the degree of p-doping on CNTs, and the $\sigma_{dc}/\sigma_{op}$ ratio demonstrates the conductivity of these CNT films. Longer sonication time and higher PSS concentration promoted the upshift of the G-band and p-doping of CNTs. However, the excess sonication caused significant damage to the CNTs, resulting in the decreased $\sigma_{dc}/\sigma_{op}$ ratio of 28 for 10 minutes from the best $\sigma_{dc}/\sigma_{op}$ ratio of 30 for 3 minutes. To avoid excess damage to the CNTs, it is crucial to take out the CNTs from the sonication bath as soon as they are dispersed. In this example, there were obtained PSS acid-doped CNT films that exhibited a higher conductivity compared to the CNT films not treated with the PSS acid irrespective of the cases where they are treated with the PSS acid aqueous solution of any one of the concentrations ranging from 0.5 to 4 wt %. Specifically, the 3 minutes sonication of 2 wt % PSS acid solution 2 achieved the best conductivity since the CNT agglomerates 1 were dispersed well and doped efficiently with the PSS acid.

Figure 18:
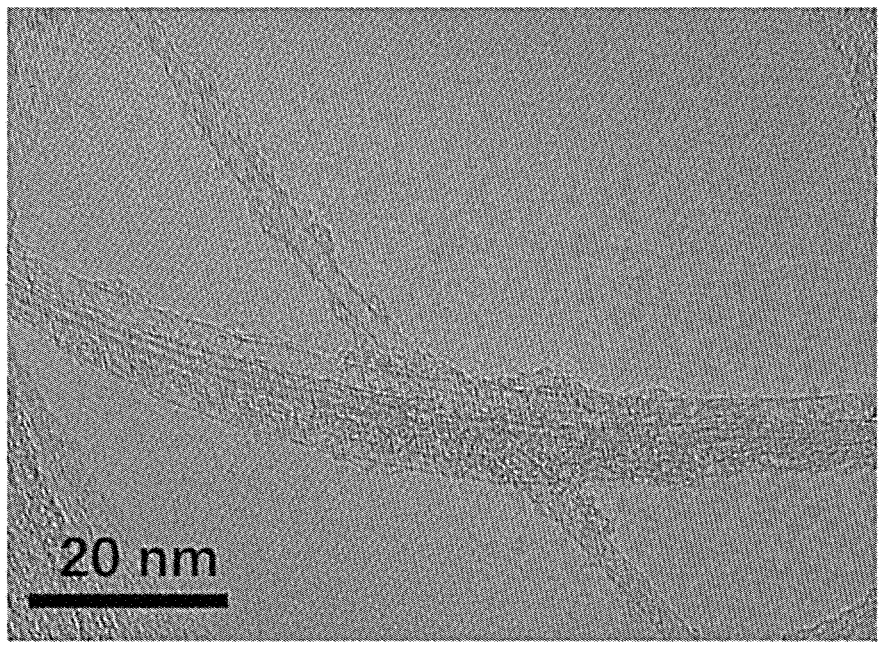
FIG. 18 shows a TEM image of the CNT films doped with PSS acid prior to washing according to the present embodiment.
Figure 19:
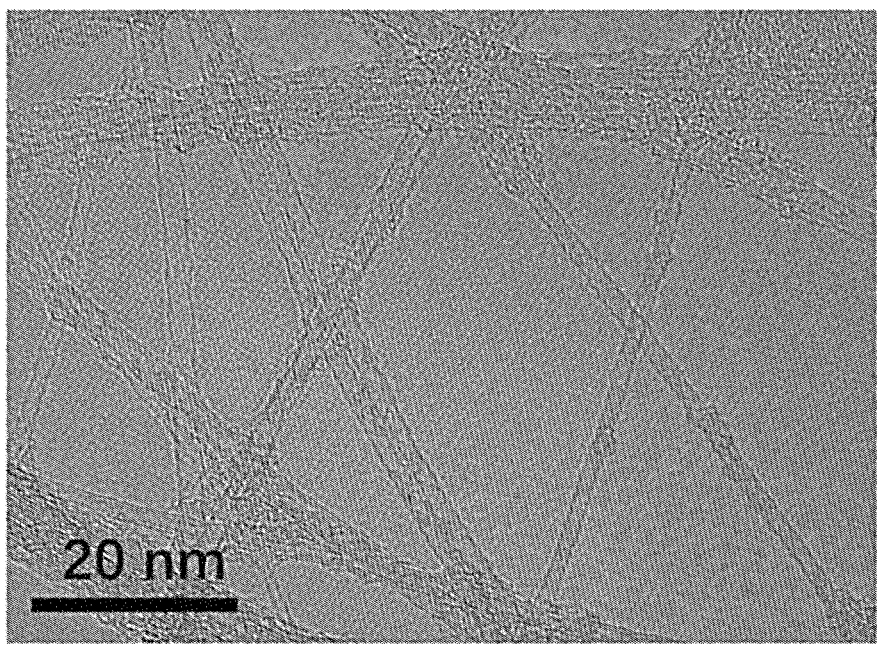
FIG. 19 shows a TEM image of the CNT films doped with PSS acid after washing according to the present embodiment.

The as-prepared CNT films doped with PSS acid potentially contain excess PSS acid that can increase the resistance at the junctions between CNTs. Accordingly, there was examined a washing process that could remove the excess PSS acid. In the process, the as-filtrated CNT films were separated from the filter to float on water, washed by heating the water bath to 97° C. for 1 hour, then transferred onto TEM grid, Si, or PET substrates for drying. First, the microstructure of the CNTs on the TEM grid was investigated by TEM. FIGS. 18 and 19, which are respectively TEM images of the CNTs before and after the washing, clearly show that individual CNTs were wrapped with a PSS acid layer that was as thin as a few nm. The large contact area between CNTs and PSS acid enabled efficient doping. After washing, CNTs had increased bare surface, showing partial removal of the PSS acid from the wall of the CNTs.

Figure 20:
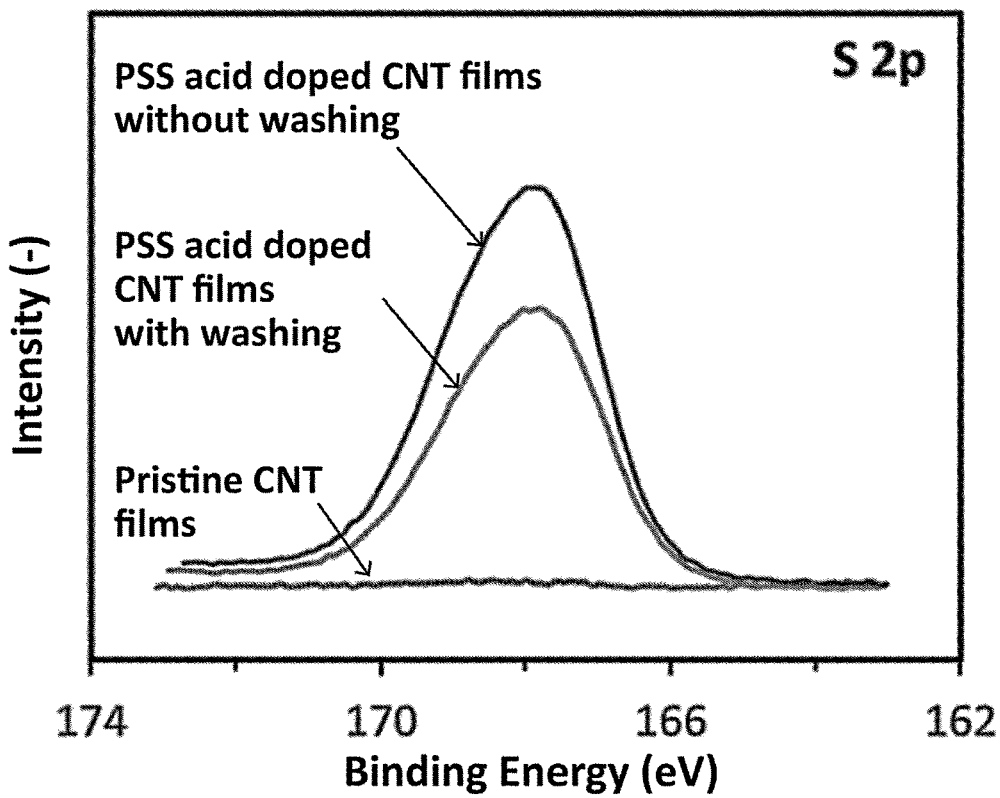
FIG. 20 is a graph showing a part of XPS spectra of the pristine CNT films, or of the CNT films doped with PSS acid with or without washing with hot water.
Figure 21:
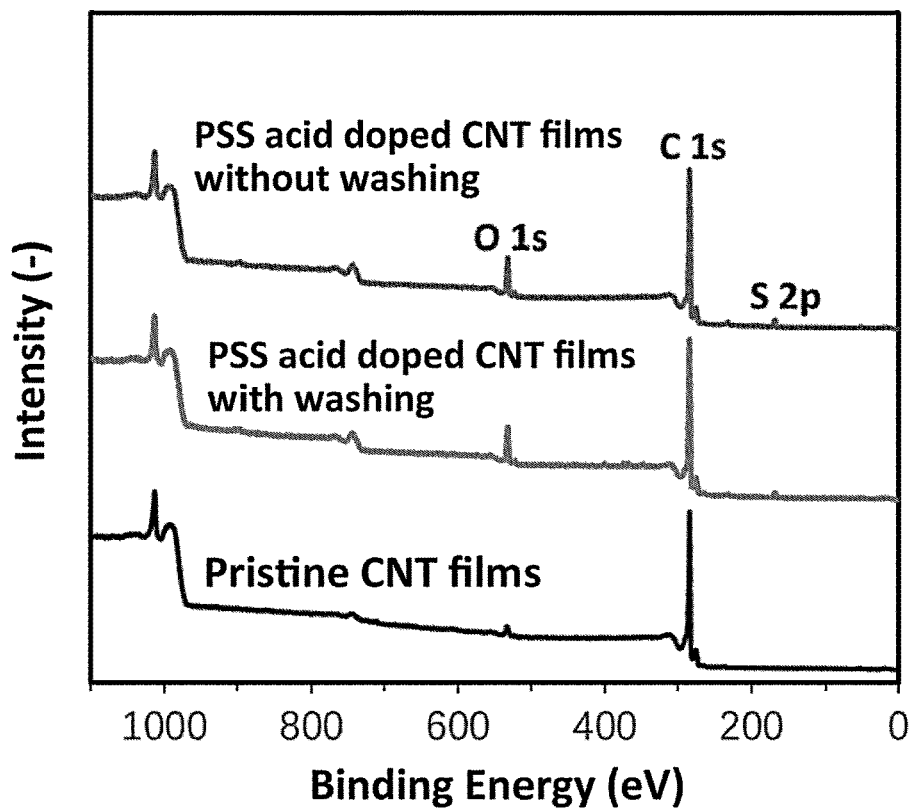
FIG. 21 is a graph showing the whole XPS spectra of the pristine CNT films, or of the CNT films doped with PSS acid with or without washing with hot water.

FIGS. 20 and 21 show the XPS spectra of the pristine agglomerates 1 of the CNTs and the CNT films 7 without and with washing with hot water. The pristine CNTs showed no peak for S 2p whereas the CNT films 7 doped with the PSS acid without and with washing clearly showed the S 2p peak located around 167.8 eV, which is attributed to the —SO$_3$H in the PSS acid. The S content decreased from 2.75 to 1.88 at % by washing, showing the reduction of the PSS acid by 32%. The detailed elemental composition is summarized in Table 1.

According to the results shown in Table 1, since C 1s is attributed to CNT and PSS acid while S 2p is attributed to PSS acid, the element ratio (S/C ratio) of sulfur (S) to carbon (C) is a good indicator for the content percentage of the PSS acid. In the PSS acid doped CNT film without washing, the S to C ratio in terms of the number of atoms is (2.75 at %)/(87.92 at %)=0.031. The S to C ratio of the PSS acid doped CNT film with washing is 0.021. If S to C ratio is defined as x, and the weight ratio of PSS acid to CNT (PSS/CNT weight ratio) is defined as y, then y can be estimated from x in a way as explained in the following. The PSS acid is expressed as $(C_8H_8O_3S)_n$ with n being an integer, and 1/n mol of the PSS acid contains 8 mol of C, 8 mol of H, 3 mol of O and 1 mol of S, and has a mass of 184 g. Using the PSS/CNT mass ratio y, the CNT has a mass of 184/y g and contains (184/y)/12=15.3/y mol of C because CNT is composed only of C. A mixture consisting of 184 g of PSS acid and 184/y g of CNTs contains 8+15.3/y mol of C and 1 mol of S, so the S/C ratio is therefore calculated as x=1/(8+15.3/y), which leads to the PSS/CNT weight ratio of y=15.3/(1/x−8). In the case of the PSS acid-doped CNT film without washing, x=0.031, which leads to y=0.63. It is therefore calculated that the film contains 61 wt % of CNT and 39 wt % of PSS acid.

TABLE 1

| | C 1s | O 1s | S 2p |
|---|---|---|---|
| Pristine CNT film | 98.33 at % | 1.62 at % | 0.05 at % |
| PSS acid doped CNT film without washing | 87.92 at % | 9.33 at % | 2.75 at % |
| PSS acid doped CNT film with washing | 89.15 at % | 8.96 at % | 1.88 at % |

Figure 22:
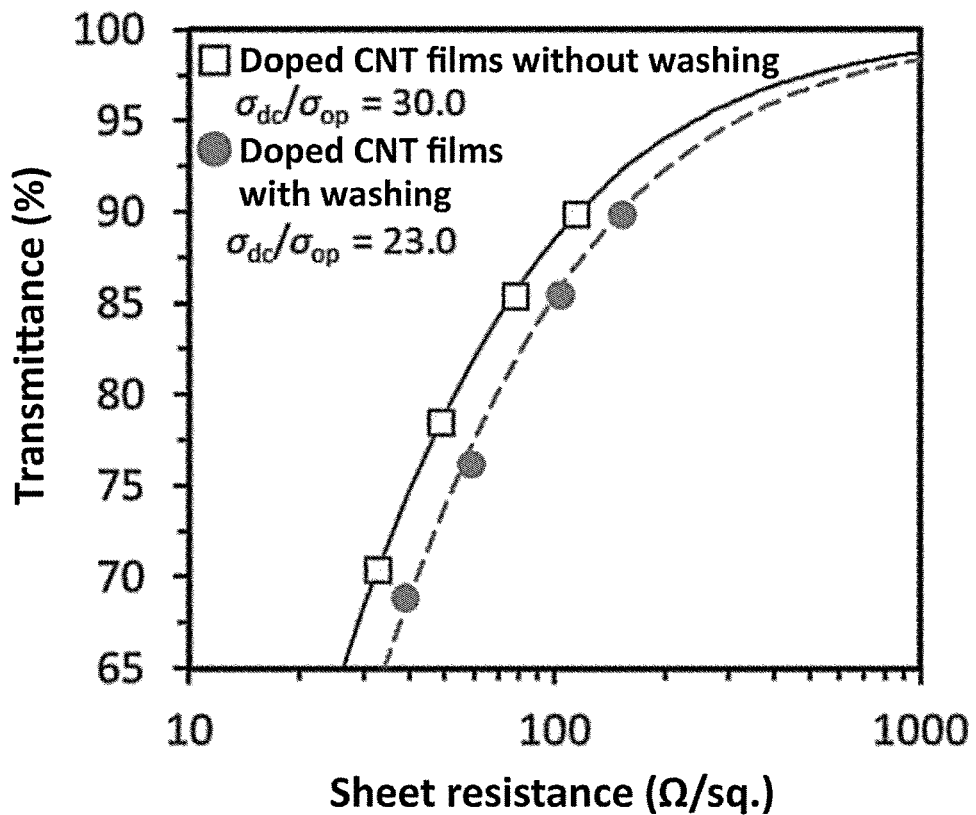
FIG. 22 is a graph showing transmittances of the CNT films doped with PSS acid with or without washing.

Next, transparent conducting properties of the PSS acid doped films 7 without and with washing were evaluated (see FIG. 22). The sheet resistance slightly increased with washing to 145 Ω/sq at 89% optical transmittance. It is thus concluded that the simple dispersion-filtration process using PSS acid aqueous solution 2 having no need for washing can yield CNT films 7 doped with the PSS acid without excess incorporation of the PSS acid. Although the PSS acid-doped CNT films were made by 2 wt % of PSS acid aqueous solution, as explained in FIG. 9, there were obtained PSS acid-doped CNT films which exhibited a higher conductivity compared to the CNT films not treated with the PSS acid irrespective of the cases where 0.5 wt % or 4 wt % of the PSS acid aqueous solution, respectively corresponding to a quarter of or twice the concentration of the solution, was employed. That is, S to C ratio may be 0.008 which is equivalent to a quarter of 0.031 for the case of PSS acid-doped CNT film without washing, or may be 0.062 which is twice the value of 0.031. The PSS acid-doped CNT films often have 50 to 90% of porosity in terms of volume fraction, and up to 90 wt % of further components, other than CNTs and PSS acid, may be contained therein, and hence the S to C ratio may be as small as one-tenth of the above-mentioned value.

Long-term stability for maintaining electrical conductivity at a high value for a long time, high-temperature stability for maintaining electrical conductivity at a high value under a high-temperature environment, and high humidity stability for maintaining electrical conductivity at a high value under a high-humidity environment are critical issues for the practical application of the conductive material 6 and the conductive film 7. For PEDOT: PSS films, PEDOT gradually agglomerates in air, resulting in larger inter-grain distances and thicker barriers for PSS, which ultimately demotes charge hopping and decreases the conductivity.

Figure 23:
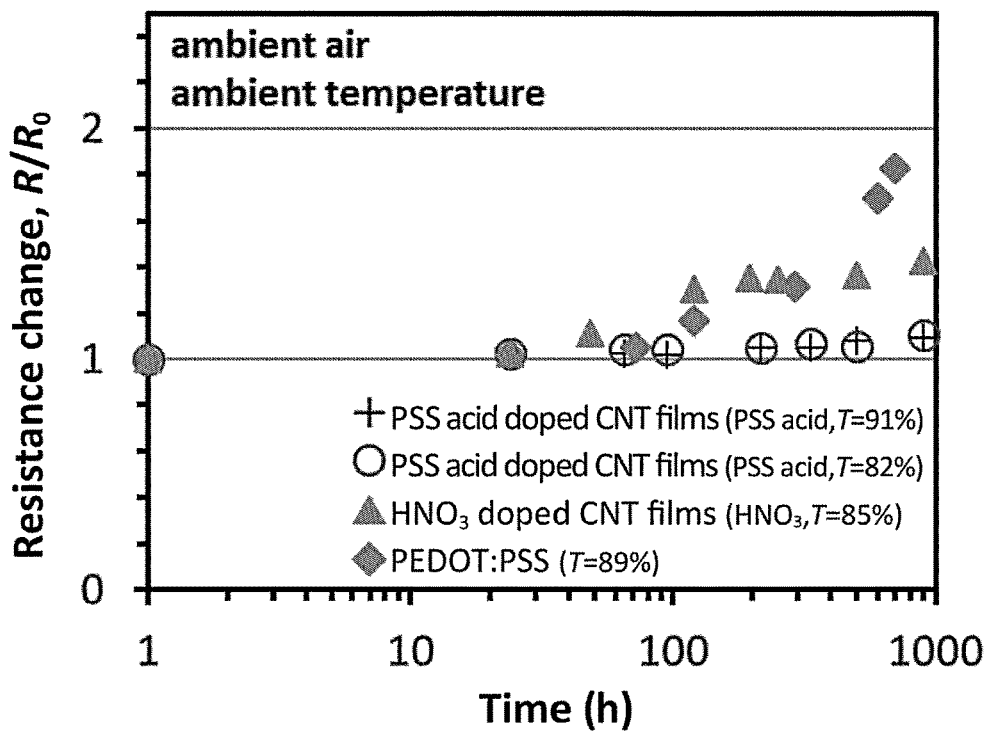
FIG. 23 is a graph showing resistance changes over time under ambient conditions according to working examples of the present invention and comparative examples.

Usually, chemical doping for CNT films is not stable due to the detachment of dopants, such as $NO_3^−/NO_2$ molecules physisorbed on the CNT surface. Under this circumstance, the long-term stability of the CNT films 7 doped with PSS acid that were prepared using PSS acid solution 2 was first investigated (See FIG. 23). The result was compared with those of two other comparative films; (i) CNT films doped with $HNO_3$ and (ii) PEDOT: PSS film. All the films were kept at ambient temperature in ambient air without any protective coatings.

The resistance of the PEDOT: PSS film in the comparative example increased sharply after 100 hours, and reached almost a doubled value after 1000 hours. The resistance of the CNT films with $HNO_3$ doping in the comparative example started to increase quickly after 50 hours, and then stabilized at 140% of the initial resistance. However, contrary to these results, the CNT films 7 doped with the PSS acid and prepared using PSS acid according to this embodiment showed good stability with only a slight increase of 10% from the initial resistance.

Figure 24:
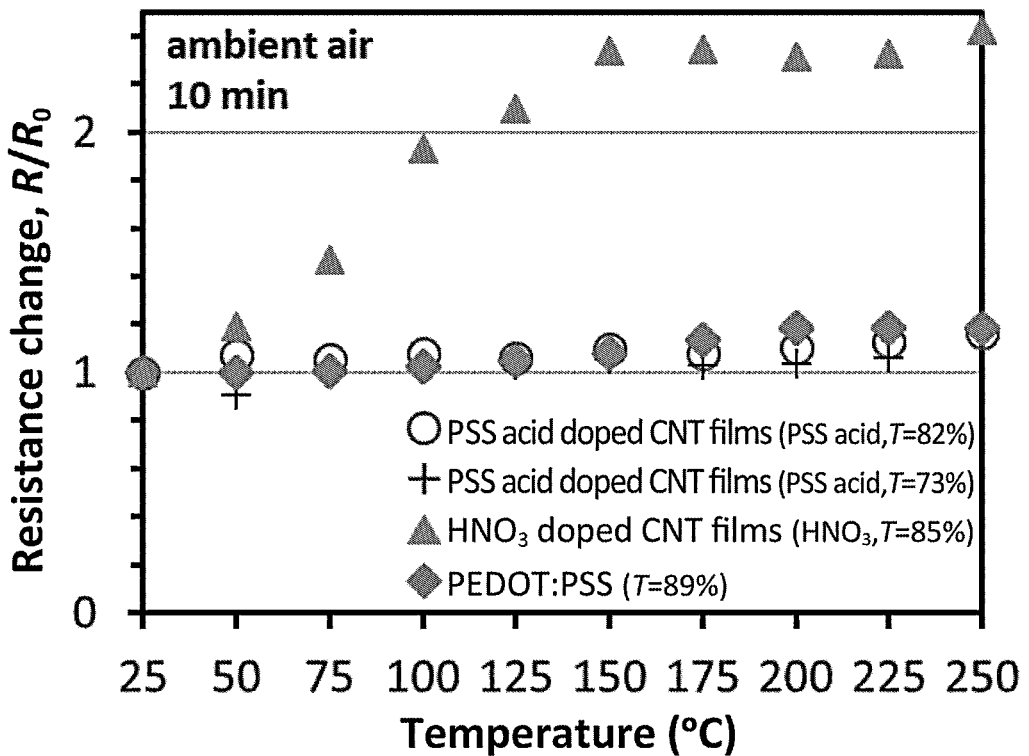
FIG. 24 is a graph showing resistance changes thereof when heated at a temperature of 25 to 250° C. for 10 minutes according to working examples of the present invention and comparative examples.

In addition, the high-temperature stability of these films was also investigated without any protective coatings (See FIG. 24). The resistance of the CNT films with $HNO_3$ doping in the comparative example increased gradually with increasing temperature, and reached 230% of its initial resistance at 150° C. The PSS doped CNT films 7 that are prepared using the PSS acid in this embodiment and the PEDOT:PSS film in the comparative example showed superior stabilities even after being heated at approximately 250° C.

Figure 25:
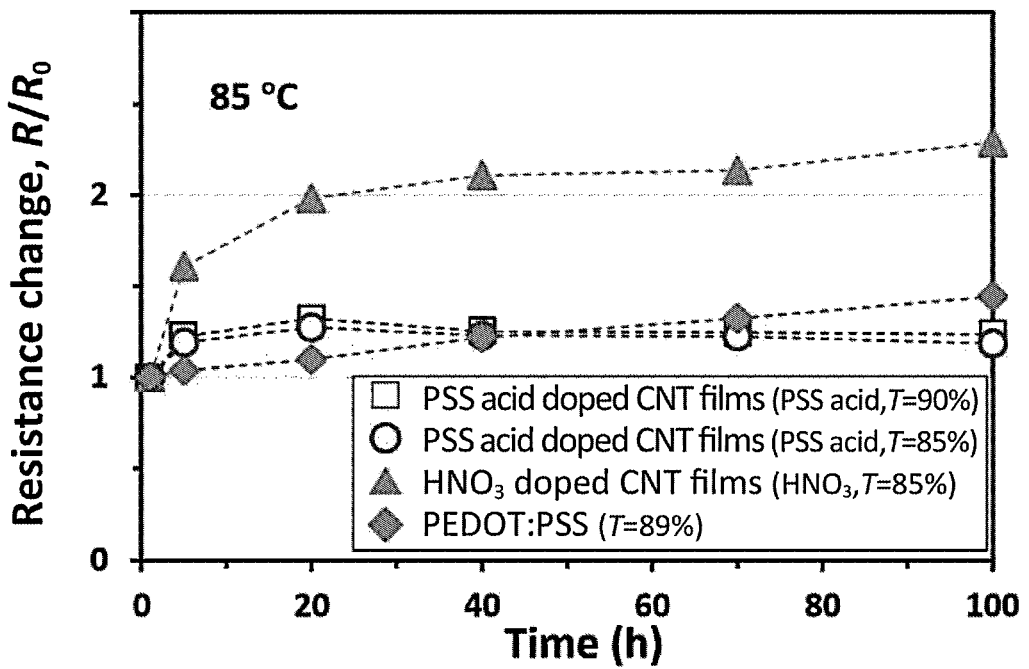
FIG. 25 is a graph showing resistance changes over time under a high humidity condition at 85° C. according to working examples of the present invention and comparative examples.

Humidity stability under a highly humid environment was also investigated without any protective coatings (FIG. 25). The CNT film doped with $HNO_3$ in the comparative example showed a quick resistance increase to 198% of its initial resistance in 20 hours, then a gradual increase to 229% after 100 hours. The PEDOT: PSS film in the comparative example showed a gradual and continuous increase to 145% of its initial resistance in 100 hours. The CNT films 7 doped with the PSS acid which were prepared using the PSS acid according to the present invention initially showed an increase to 128 to 132% of their initial resistances in 20 hours, then a slight decrease to 119 to 124% after 100 hours. The CNT films 7 doped with PSS acid according to the present invention also showed the best stability under the humidity condition.

These results show excellent stabilities of the PSS acid doped CNT film 7 under an ambient environment and at high temperature and high humidity conditions.

<Fabrication of PSS Acid-Doped CNT Films of Various Thicknesses>

CNT films 7 doped with PSS acid were fabricated on a membrane filter 5 in a way similar to the working example of <Fabrication of CNT films doped with PSS acid> except that the filtrated amount of the CNT dispersion liquid was changed. The PSS acid aqueous solution 2 used for it had 2 wt % of concentration to which three minutes of sonification was applied for dispersion. The sheet resistance of the CNT films 7 doped with PSS acid and fabricated on the membrane filter 5 was measured by the four-point-probe method. The CNT films 7 doped with PSS acid were removed from the membrane filter 5 with tweezers, and then the weights and thicknesses of the CNT films 7, doped with PSS acid, were respectively measured by an electronic scale and an electronic micrometer.

The weights per unit area of the CNT films 7, doped with PSS acid, were varied from 16.1 to 226 μg/cm² to make PSS acid-doped CNT films having various thicknesses. The heaviest film of 226 μg/cm² has a thickness of 5.25 μm and a film density of 0.43 g/cm³. The CNTs used for it had a diameter of 2 nm and were composed mainly of single-walled CNTs with a density of 1.5 g/cm³ to which "Ch.

Laurent, et al., Carbon 2010, 48, 2989" is referred. The density of PSS acid was estimated to be 11 g/cm³ to which the following website of URL: "https://www.chemicalbook.com/chemicalproductproperty_en_cb2307202.htm" can be referred. With reference to the working example of <Fabrication of CNT films doped with PSS acid>, this film is estimated to contain, 61 wt % of CNTs and 39 wt % of PSS acid, and has 0.26 g and 0.17 cm³ of CNTs, and 0.17 g and 0.15 cm³ of PSS acid per 1 cm³ of this film. Accordingly, the film is estimated to have 0.68 cm³ of porosity or 68% of volume fraction per 1 cm³ of this film.

Figure 26:
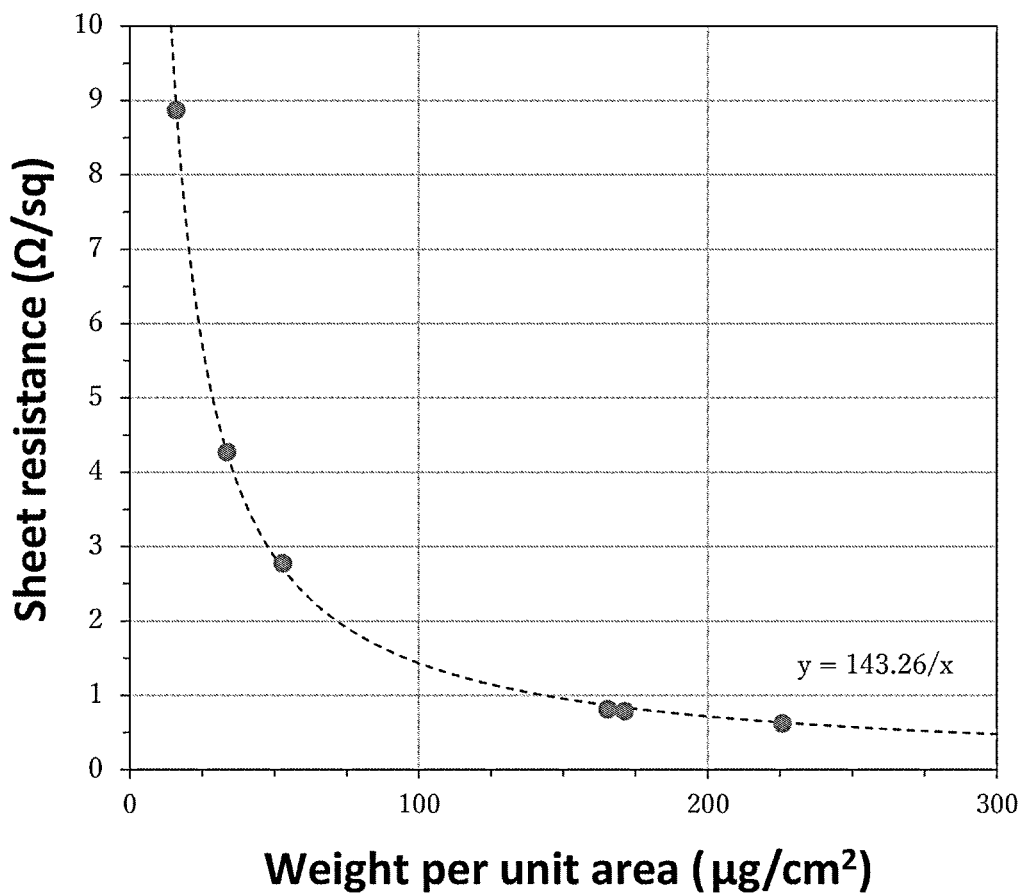
FIG. 26 is a graph showing a relationship between the sheet resistance and the weight per unit area of a CNT film doped with the PSS acid according to a working example of the present invention.

FIG. 26 and Table 2 illustrate a relationship between weights per unit area and sheet resistances which are in inverse proportion to each other. e.g., 8.87 Ω/sq and 0.62 Ω/sq were measured for 16.1 μg/cm² and 226 μg/cm², respectively. The film thickness t (cm) can be expressed as t=w/d, where d is film density (g/cm³) and w is the weight per unit area (g/cm²). The sheet resistance $R_S$ (Ω/sq) can be expressed as $R_S$=ρ/t=ρd/w, where ρ is electric resistivity (Ω cm). FIG. 26 shows that $R_S$ and w were in inverse proportion to each other, which leads to a conclusion that the weight per unit area and film thickness of the CNT films doped with PSS acid were successfully controlled with the film density d and electric resistivity ρ being kept at constant levels for these films.

TABLE 2

| Weight per unit area (μg/cm²) | Sheet resistance (Ω/sq) |
|---|---|
| 226 | 0.62 |
| 171 | 0.78 |
| 165 | 0.81 |
| 53 | 2.77 |
| 34 | 4.27 |

<Fabrication of Solar Cell Utilizing CNT Films Doped with PSS Acid>

Explained hereunder is an application to a solar cell that implements CNT films doped with PSS acid. It has been known that a CNT film doped into p-type which is formed on the surface of an n-type Si substrate creates a heterojunction solar cell. Since CNT films tend to be deprived of electrons by water or oxygen in the air, and are weakly doped into p-type, the CNT films formed on an n-type silicon substrate readily create a solar cell. In this example, solar cells utilizing CNT films doped with PSS acid were set as working examples and those with no PSS acid dope were set as comparative examples.

Figure 27:
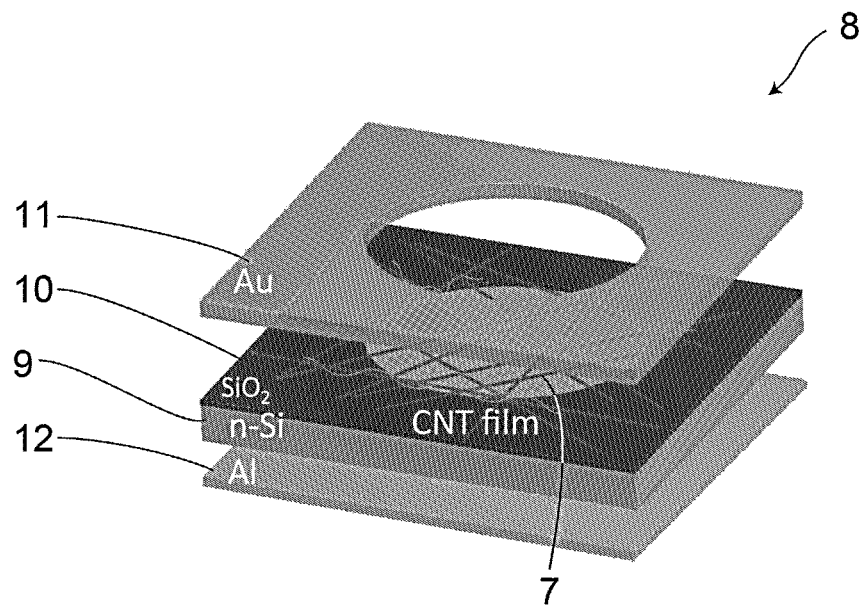
FIG. 27 is a schematic view showing a solar cell structure according to a working example of the present invention and a comparative example.
Figure 28:
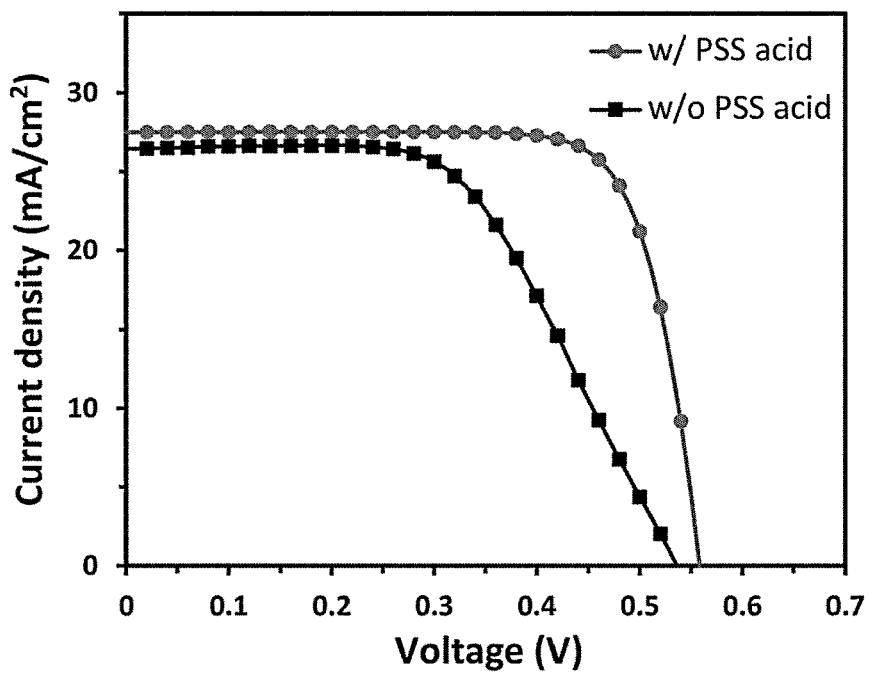
FIG. 28 is a graph showing the current density-voltage characteristics of solar cells according to a working example of the present invention and a comparative example.

FIG. 27 illustrates a schematic view showing the structure of a solar cell 8 according to working and comparative examples, and FIG. 28 illustrates the current density-voltage characteristics of the solar cells according to a working example and a comparative example.

Explained hereunder is a fabrication procedure of the solar cell 8. There was used an n-doped Si (100) substrate 9 (resistivity: 1-5S1 cm; dopant: P) with a thermally oxidized film (SiO₂) 10 of a thickness of 500 nm being formed thereon, the thermally oxidized film 10 having a φ2 mm round hole bored therein. CNT films 7 doped with PSS acid were fabricated in a way similar to the method explained in the section of <Fabrication of CNT films doped with PSS acid>. That is, CNTs were agitated in 2 wt % of PSS acid aqueous solution and then were subjected to sonification for three minutes for dispersion, and vacuum filtrated to form PSS acid-doped CNT films 7 on the membrane filter 5. The PSS acid-doped CNT films 7, dipped into deionized water and floated on the surface of water, were collected on the surface of n-doped silicone substrate 9. The CNT films without PSS acid dope were made in a way similar to the working examples except that 0.5 wt % of SDBS aqueous solution was used in place of the 2 wt % of PPS acid aqueous solution, and that the CNT films were heated together with the deionized water at 95 to 97° C. for 70 minutes during which the CNT films were floated on top of the deionized water, thus eliminating SDBS. Then, a metal foil was placed on top of the hole of the thermally oxidized film 10 of the Si substrate 9 with the CNT film, and an Au film 11 was formed on top of it by means of RF magnetron sputtering to thereby fabricate an Au electrode on the surface thereof. After that, a film 12 of Al was formed by means of RF magnetron sputtering on the backside of the Si substrate 9 to form a backside Al electrode.

A heterojunction solar cell 8 of PSS acid doped CNT film/n-Si which was fabricated as a working example and a heterojunction solar cell of no doped CNT film/n-Si which was fabricated as a comparative example were evaluated for their power generation properties by means of a solar simulator (CEP-2000MLQ by Bunkoukeiki Co., Ltd, xenon lamp, AM1.5G, 100 mW/cm²) and a solar cell evaluation system (YQ-2000 by JASCO Corporation)

Current density-voltage characteristics in FIG. 28 indicate that the solar cell 8 employing PSS acid-doped CNT films significantly improved its fill factor (FF) compared to the solar cell 8 that employs CNT films without any PSS acid dope, indicating significant improvement in its power generation efficiency. Table 3 summarizes the evaluation results of four solar cells that were prepared for each of the working and comparative examples. Short-circuit current density (Jsc) and open-circuit voltage (Voc) both improved in the working examples compared to those in the comparative examples, and while the average power conversion efficiency (PCE) of the comparative examples was 7.71%, the corresponding average power conversion efficiency (PCE) of the working examples was 11.69% which indicates a significant improvement. This would be because the CNTs, strongly doped into p-type by PSS acid, promote a more efficient separation of electrons and holes on top of improved conductivity in the CNT films, which thereby allows charges to be more efficiently transported from a location of the round hole in the thermally oxidized film to the Au electrode.

TABLE 3

| | | $J_{sc}$ [mA/cm²] | $V_{oc}$ [V] | FF | PCE [%] |
|---|---|---|---|---|---|
| Without PSS acid | Comparative example (a) | 25.96 | 0.54 | 0.56 | 7.81 |
| | Comparative example (b) | 26.54 | 0.53 | 0.57 | 7.85 |
| | Comparative example (c) | 26.16 | 0.54 | 0.54 | 7.67 |
| | Comparative example (d) | 24.25 | 0.53 | 0.57 | 7.49 |
| | Average | 25.73 | 0.535 | 0.560 | 7.71 |
| | Standard deviation | 1.014 | 0.006 | 0.014 | 0.163 |
| With PSS acid | Working example (a) | 27.5 | 0.56 | 0.77 | 11.85 |
| | Working example (b) | 26.41 | 0.56 | 0.76 | 11.30 |
| | Working example (c) | 27.29 | 0.57 | 0.77 | 12.03 |
| | Working example (d) | 27.83 | 0.56 | 0.75 | 11.58 |
| | Average | 27.26 | 0.56 | 0.76 | 11.69 |

TABLE 3-continued

|  | $J_{sc}$ [mA/cm$^2$] | $V_{oc}$ [V] | FF | PCE [%] |
|---|---|---|---|---|
| Standard deviation | 0.608 | 0.005 | 0.011 | 0.321 |

Figure 29:
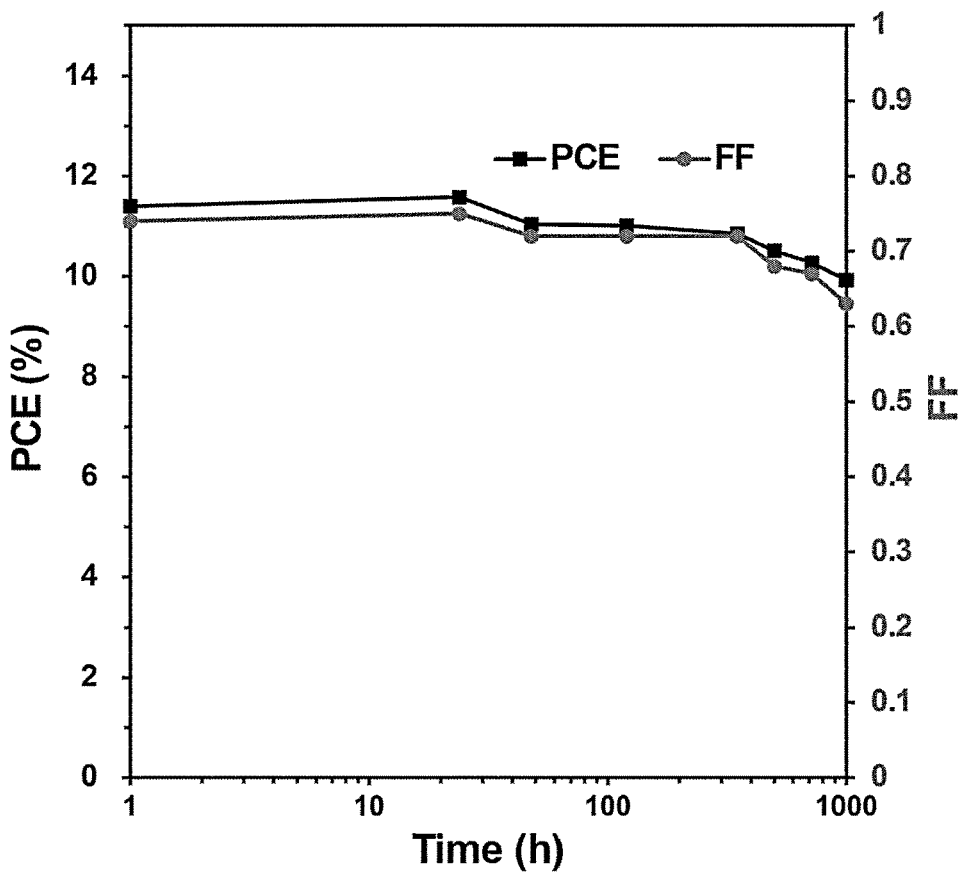
FIG. 29 is a graph showing a fill factor (FF), indicating power generation stability, and a power conversion efficiency (PCE) of the solar cell according to a working example of the present invention.

FIG. 29 indicates the power generation stability of the solar cell 8 which was held in a normal room environment without any protective coatings being formed on the surface of the PSS acid-doped CNT films for measuring its power generating properties. The initial PCE was 11.40%, and then the PCE became 9.92% after a lapse of 1000 hours. This value is sufficiently a high value in terms of its functionality compared to the initial PCE of 7.71% in the comparative example, which indicates that the heterojunction solar cell 8 of PSS acid doped CNT film/n-Si steadily maintains its performance at a high level.

Next, solar cells incorporating Nafion in CNT films doped with PSS acid were fabricated. First, solar cells that implement CNT films doped with PSS acid were fabricated in a way as explained hereinabove. Then, Nafion solution (10 wt % concentration, FUJIFILM Wako Pure Chemical Corporation, Osaka, Japan) was diluted by 2-propanol (FUJIFILM Wako Pure Chemical Corporation, Osaka, Japan) to prepare 5 wt % of Nafion solution which was then used for spin coating (6000 rpm, 30 seconds) on the solar cell before being dried in a laboratory environment. The Nafion penetrated into free spaces of the CNT films doped with PSS acid to form composite films over which an excessive Nafion formed a layer of the same on the surface of the composite films. The CNTs, PSS acid and Nafion respectively had the weight per unit area of 0.7 µg/cm$^2$, 0.4 µg/cm$^2$ and 51.6 µg/cm$^2$. According to the working example of <Fabrication of PSS acid-doped CNT films of various thicknesses>, the film density of CNT-PSS acid film prior to Nafion coating was 0.43 g/cm$^3$ and porosity of 68% volume fraction, which leads to a film thickness of the CNT-PSS acid film of (1.1 µg/cm$^2$)/(0.43 g/cm$^3$)=26 nm, and the corresponding film thickness of porosity of (26 nm)×(0.68) =17 nm. Nafion has a density of 1.97 g/cm$^3$ to which "Ishida, et al., J. Soc. Mater. Sci. Jpn. 2007, 56, 1005" can be refereed. It is therefore inferred that 3.4 µg/cm$^2$ of Nafion was penetrated into the free space of the CNT-PSS acid films in the process of applying Nafion to thereby form CNT-PSS acid-Nafion composite films composed of 0.7 µg/cm$^2$ of CNT, 0.4 µg/cm$^2$ of PSS acid, and 3.4 µg/cm$^2$ of Nafion with 76 wt % Nafion. It was also inferred that an excess of approximately 48 µg/cm$^2$ Nafion formed a Nafion layer having a thickness of approximately 250 nm on top of it. A heterojunction solar cell 8 of PSS acid doped CNT film/n-Si which was coated with Nafion and fabricated as a working example was evaluated for its power generation properties by means of a solar simulator (CEP-2000MLQ by Bunkoukeiki Co., Ltd, xenon lamp, AM1.5G, 100 mW/cm$^2$) and a solar cell evaluation system (YQ-2000 by JASCO Corporation).

Figure 30:
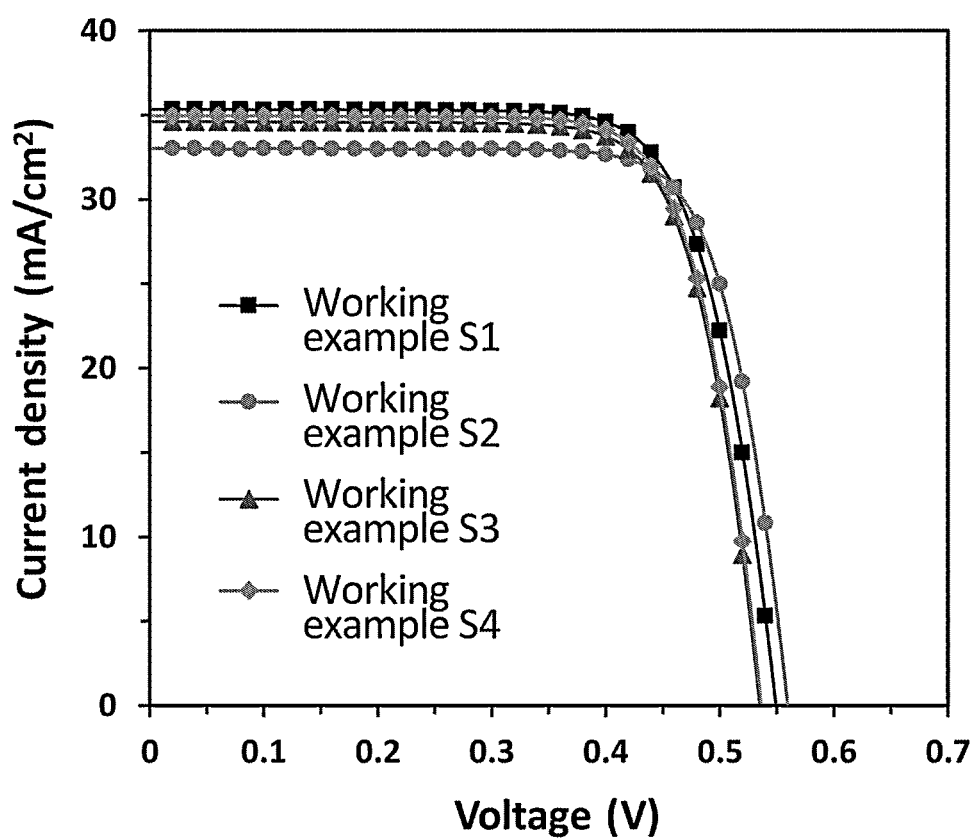
FIG. 30 is a graph showing the current density-voltage characteristics of solar cells incorporating Nafion in the CNT films doped with PSS acid according to working examples of the present invention.

For the working examples S1 to S4 of the solar cells incorporating Nafion in CNT films doped with PSS acid, the current density-voltage characteristics in FIG. 30 and the evaluation results as outlined in Table 4 indicate that the solar cells, incorporating CNT film/n-Si doped with PSS acid but with no Nafion, had, on average, Jsc of 27.26 mA/cm$^2$ while that of the solar cells, incorporating Nafion coating in the CNT film/n-Si doped with PSS acid, was significantly improved to 34.47 mA/cm$^2$, and as a result of which the average power generating efficiency has been greatly enhanced from 11.69 to 14.12%. These results indicate possibilities of fabricating a composite film that incorporates Nafion between free spaces of CNT films doped with PSS acid without impairing their characteristics as well as Nafion films formed on top of it, and the results also indicate that film density and refraction index of these films can be controlled to provide antireflection functionality which in turn allows the solar cell to have improved characteristics.

TABLE 4

|  |  | $J_{sc}$ [mA/cm$^2$] | $V_{oc}$ [V] | FF | PCE [%] |
|---|---|---|---|---|---|
| w/PSS acid + w/Nafion | Working example S1 | 35.33 | 0.55 | 0.74 | 14.41 |
|  | Working example S2 | 33.01 | 0.56 | 0.76 | 14.12 |
|  | Working example S3 | 34.60 | 0.54 | 0.75 | 13.90 |
|  | Working example S4 | 34.95 | 0.54 | 0.75 | 14.06 |
|  | Average | 34.47 | 0.55 | 0.75 | 14.12 |
|  | Standard deviation | 1.020 | 0.010 | 0.008 | 0.213 |

As shown hereinabove, a simple and efficient method for dispersing/doping CNTs with the use of PSS acid aqueous solution 2 allowed the manufacturing of PSS acid-doped CNT films 7 which are highly transparent, conductive and stable. PSS acid wraps CNTs to allows efficient dispersion and doping. A three-minutes sonification process in 2 wt % PSS acid aqueous solution 2 allowed CNTs to be almost fully (about 90%) dispersed therein by four repeating cycles of dispersion/extraction processes, and the resultant PSS doped CNT films 7 exhibited a low sheet resistance of 115 Ω/sq with 90% light transmissibility. These PSS doped CNT films 7 exhibited long-term stabilities for 1000 hours under atmospheric conditions, high thermal stabilities at 250° C. in the air, and high humidity stabilities at 85° C. without forming any protective film. Further, heterojunction solar cells with the PSS acid CNT film adhered on the surface of n-Si substrates stably maintained energy conversion efficiencies at high levels. Furthermore, the heterojunction solar cells were significantly improved in their functionality with PSS acid-doped CNT films that incorporate Nafion. These simple processes are advantageous for manufacturing low-cost, rare metal-free and stable transparent conductive films (TCF) for a variety of devices including flexible electronic devices and solar cells.

Although the present invention has been described based on the embodiments and working examples, a variety of modified embodiments may be carried out for the present invention. For example, although the present invention has been described with reference to FIGS. 1 to 4 of flowcharts for the process of manufacturing the conductive material 6 and conductive film 7, as well as to FIGS. 5A to 5E showing schematic drawings for carrying out these processes, these containers or devices are mere outlines and shall not be limited to those shown in the figures as long as they are capable of carrying out similar processes.

DESCRIPTION OF THE SYMBOLS

1 CNT agglomerates
2 PSS acid aqueous solution
3 Supernatant
4 Sediment
5 Membrane filter 6 Conductive material, CNT-PSS acid conductive material
7 Conductive film, CNT-PSS acid conductive film, CNT film doped with PSS acid
8 Solar cell
9 Si substrate
10 Thermally oxidized film (SiO$_2$)
11 Au film
12 Al film

What is claimed is:

1. A conductive material consisting of a mixture of carbon nanotubes (CNTs) and a dispersant of polystyrene sulfonic acid (PSS acid), wherein the conductive material contains no other dispersant than said dispersant of PSS acid and said dispersant works as a dopant.

2. The conductive material according to claim 1, wherein an element ratio (S/C ratio) of sulfur (S) to carbon (C) in terms of the number of atoms in the mixture is from 0.001 to 0.1.

3. A conductive film comprised of the conductive material according to claim 1, wherein weight per unit area of the CNTs is from 1 mg/m$^2$ to 10000 mg/m$^2$.

4. A conductive film comprised of the conductive material according to claim 2, wherein weight per unit area of the CNTs is from 1 mg/m$^2$ to 10000 mg/m$^2$.

5. A solar cell comprising the conductive film according to claim 3, wherein the conductive film is on a semiconductor surface of the solar cell.

6. A solar cell comprising the conductive film according to claim 4, wherein the conductive film is on a semiconductor surface of the solar cell.

* * * * *